(12) United States Patent
Kim et al.

(10) Patent No.: US 11,972,080 B2
(45) Date of Patent: Apr. 30, 2024

(54) TOUCH DISPLAY DEVICE AND FILM FOR TOUCH DISPLAY DEVICE

(71) Applicant: LG DISPLAY CO., LTD., Seoul (KR)

(72) Inventors: Wonrae Kim, Gyeonggi-do (KR); KyungKook Jang, Gyeonggi-do (KR); JongHoon Woo, Gyeonggi-do (KR); Sungjin Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/962,124

(22) Filed: Oct. 7, 2022

(65) Prior Publication Data

US 2023/0214070 A1 Jul. 6, 2023

(30) Foreign Application Priority Data

Dec. 30, 2021 (KR) .................. 10-2021-0193019

(51) Int. Cl.
*G06F 3/044* (2006.01)
*G06F 3/041* (2006.01)
*H10K 59/40* (2023.01)

(52) U.S. Cl.
CPC .......... *G06F 3/0445* (2019.05); *G06F 3/0412* (2013.01); *G06F 3/0446* (2019.05); *H10K 59/40* (2023.02); *G06F 2203/04112* (2013.01)

(58) Field of Classification Search
CPC .... G06F 3/0412; G06F 3/0446; G06F 3/0445; H10K 59/40
USPC .................................................. 345/173–174
See application file for complete search history.

(56) References Cited

U.S. PATENT DOCUMENTS

| | | | | |
|---|---|---|---|---|
| 2022/0140010 A1* | 5/2022 | Lee | ....... | H10K 59/121 345/173 |
| 2022/0187979 A1* | 6/2022 | Jung | ........ | G06F 3/04166 |
| 2022/0244806 A1* | 8/2022 | Kim | ........ | G06F 3/046 |

* cited by examiner

*Primary Examiner* — Calvin C Ma
(74) *Attorney, Agent, or Firm* — POLSINELLI PC

(57) ABSTRACT

A touch display device and a film for the touch display device, capable of increasing power efficiency to provide a hover touch function, by providing a touch display device comprising a display panel having a plurality of subpixels, and having a plurality of data lines and a plurality of gate lines electrically connected with the plurality of subpixels, a touch panel having a plurality of driving touch electrodes positioned to overlap with at least one subpixel among the plurality of subpixels, a touch driving signal for touch sensing applied to one or more driving touch electrodes among the plurality of driving touch electrodes, and a magnetic substance disposed around each of the plurality of driving touch electrodes, on the plurality of driving touch electrodes.

21 Claims, 21 Drawing Sheets

US 11,972,080 B2

TOUCH DISPLAY DEVICE AND FILM FOR TOUCH DISPLAY DEVICE

CROSS-REFERENCE TO RELATED APPLICATION

This application claims the priority of Korean Patent Application No. 10-2021-0193019, filed on Dec. 30, 2021, which is hereby incorporated by reference in its entirety.

BACKGROUND

Field of the Disclosure

The present disclosure relates to a touch display device and a film for the touch display device.

Description of the Background

The growth of the intelligent society leads to increased demand for image display devices and use of various types of display devices, such as liquid crystal displays, organic light emitting displays, etc.

The display device recognizes a touch on the display, by the user's finger or a stylus, panel and performs input processing based on the recognized touch so as to provide more various functions to the user.

Recently available are display devices providing a "hover touch" (also known as "hovering touch") function that enables touch entry even without the user's touch on the touch display device to provide the user with more diversified experiences.

However, such "hover touch" capable touch display devices adopt (e.g., the approach of applying) a high-voltage signal for touch sensing to sense a touch object away from the touch display device and consumes significant power in the touch display device.

Accordingly, a need exists for a touch display device capable of providing the hover touch function at reduced power consumption.

SUMMARY

Accordingly, the present disclosure is to provide a touch display device and a film for the touch display device, which can implement hover touch while reducing power consumption.

In an aspect of the present disclosure, a touch display device includes a display panel having a plurality of subpixels, and having a plurality of data lines and a plurality of gate lines electrically connected with the plurality of subpixels, a touch panel having a plurality of driving touch electrodes positioned to overlap with at least one subpixel among the plurality of subpixels, a touch driving signal for touch sensing applied to one or more driving touch electrodes among the plurality of driving touch electrodes, and a magnetic substance disposed around each of the plurality of driving touch electrodes, on the plurality of driving touch electrodes.

In another aspect of the present disclosure, a film for a touch display device, the touch display device includes a display panel having a plurality of subpixels, and having a plurality of data lines and a plurality of gate lines electrically connected with the plurality of subpixels and a touch panel having a plurality of driving touch electrodes positioned to overlap with at least one subpixel among the plurality of subpixels, a touch driving signal for touch sensing applied to one or more driving touch electrodes among the plurality of driving touch electrodes, wherein the film for the touch display device comprises a substrate and a magnetic substance positioned on the substrate and disposed around each of the plurality of driving touch electrodes, on the plurality of driving touch electrodes.

According to various aspects of the present disclosure, there may be provided a touch display device and a film for the touch display device, which may implement hover touch while reducing power consumption.

DESCRIPTION OF THE DRAWINGS

The above and other features and advantages of the disclosure will be more clearly understood from the following detailed description, taken in conjunction with the accompanying drawings, in which.

DETAILED DESCRIPTION

Figure 1:
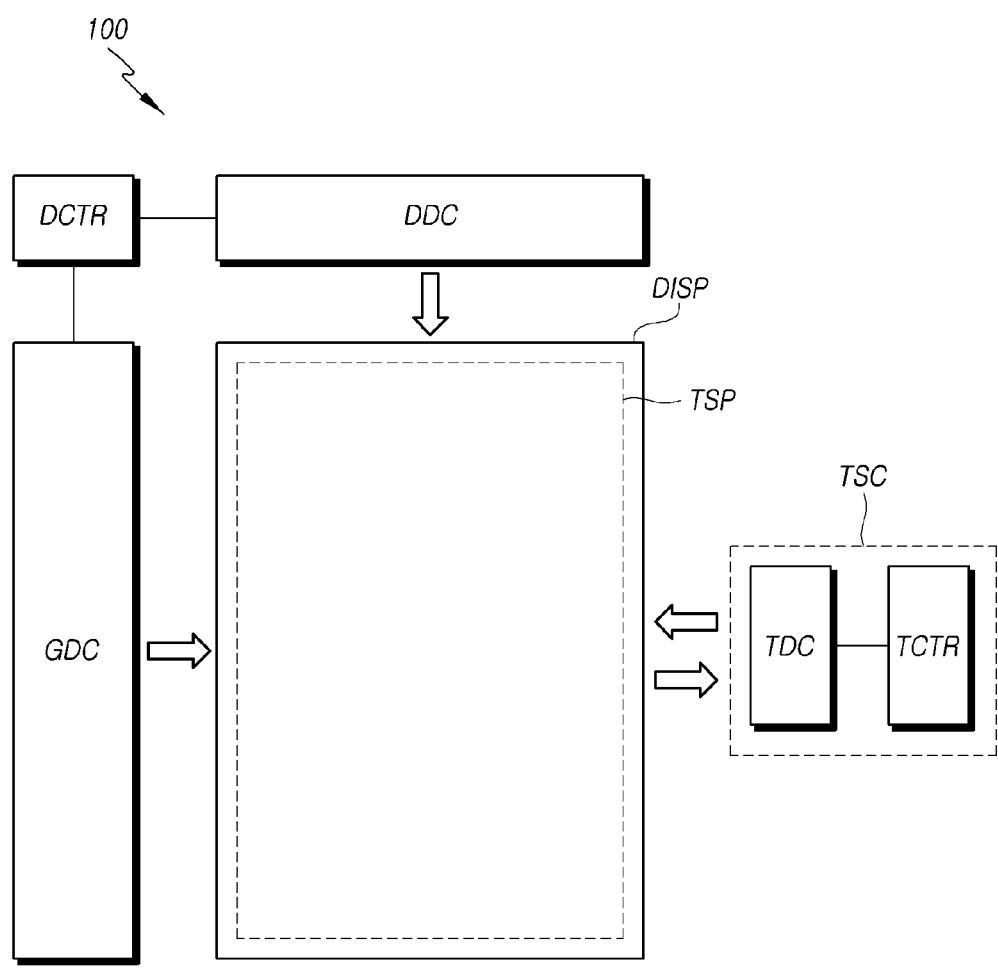
FIG. 1 is a schematic view illustrating a system configuration of a touch display device 100 according to aspects of the disclosure.

In the following description of examples or aspects of the disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the disclosure, detailed descriptions of well-known functions and components incorporated herein will be omitted when it is determined that the description may make the subject matter in some aspects of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlap withs" etc. a second element, it should be interpreted that, not only can the first element "be directly connected or coupled to" or "directly contact or overlap with" the second element, but a third element can also be "interposed" between the first and second elements, or the first and second elements can "be connected or coupled to", "contact or overlap with", etc. each other via a fourth element. Here, the second element may be included in at least one of two or more elements that "are connected or coupled to", "contact or overlap with", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various aspects of the disclosure are described in detail with reference to the accompanying drawings.

FIG. 1 is a view illustrating a system configuration of a touch display device 100 according to aspects of the disclosure.

Referring to FIG. 1, the touch display device 100 according to aspects of the disclosure may provide both a function for displaying images and a function for touch sensing.

To provide the image display function, the touch display device 100 according to aspects of the disclosure may include a display panel DISP, which has a plurality of data lines and a plurality of gate lines and a plurality of subpixels electrically connected with the plurality of data lines and the plurality of gate lines, a data driving circuit DDC configured to drive the plurality of data lines, a gate driving circuit GDC configured to drive the plurality of gate lines, and a display controller DCTR for controlling the data driving circuit DDC and the gate driving circuit GDC.

The data driving circuit DDC, the gate driving circuit GDC, and the display controller DCTR each may be implemented as one or more individual components. In some cases, two or more of the data driving circuit DDC, the gate driving circuit GDC, and the display controller DCTR may be integrated into a single component. For example, the data driving circuit DDC and the display controller DCTR may be implemented as a single integrated circuit (IC) chip.

To provide the touch sensing function, the touch display device 100 according to aspects of the disclosure may include a touch panel TSP including a plurality of touch electrodes and a touch sensing circuit TSC supplying touch driving signals to the touch panel TSP, detecting touch sensing signals from the touch panel TSP, and sensing whether there is the user's touch or the position of a touch (touch coordinates) on the touch panel TSP based on the detected touch sensing signals.

As an example, the touch sensing circuit TSC may include a touch driving circuit TDC supplying touch driving signals to the touch panel TSP and detecting touch sensing signals from the touch panel TSP and a touch controller TCTR sensing whether there is the user's touch on the touch panel TSP and/or the position of a touch based on the touch sensing signal detected by the touch driving circuit TDC.

The touch driving circuit TDC may include a first circuit part supplying touch driving signals to the touch panel TSP and a second circuit part detecting touch sensing signals from the touch panel TSP.

The touch driving circuit TDC and the touch controller TCTR may be implemented as separate components or, in some cases, be integrated into a single component.

The data driving circuit DDC, the gate driving circuit GDC, and the touch driving circuit TDC each may be implemented as one or more integrated circuits and, in light of electrical connection with the display panel DISP, they may be implemented in a chip-on-glass (COG) type, chip-on-film (COF) type, or tape-carrier-package (TCP) type. The gate driving circuit GDC may also be implemented in a gate-in-panel (GIP) type.

The circuit components (DDC, GDC, and DCTR) for display driving and the circuit components (TDC and TCTR) for touch sensing each may be implemented as one or more individual components. In some cases, one or more of the circuit components (DDC, GDC, and DCTR) for display driving and one or more of the circuit components (TDC and TCTR) for touch sensing may be functionally integrated into one or more components.

For example, the data driving circuit DDC and the touch driving circuit TDC may be integrated into one or two or more integrated circuit chips. Where the data driving circuit DDC and the touch driving circuit TDC are integrated into two or more integrated circuit chips, each of the two or more integrated circuit chips may have the data driving function and the touch driving function.

The touch display device 100 according to aspects of the disclosure may be of various types, such as an organic light emitting display device, a liquid crystal display, and the like. In the following example, the touch display device 100 is an organic light emitting display device for ease of description. In other words, although the display panel DISP comes in various types, e.g., as an organic light emitting display panel or a liquid crystal display panel, an example is described below in which the display panel DISP is an organic light emitting display panel for ease of description.

As described below, the touch panel TSP may include a plurality of touch electrodes to which touch driving signals are applied or from which touch sensing signals may be detected and a plurality of touch routing lines for electrically connecting the plurality of touch electrodes with the touch driving circuit TDC.

The touch panel TSP may be present outside the display panel DISP. In other words, the touch panel TSP and the display panel DISP may be separately manufactured and then combined together. Such touch panel TSP is referred to as an external type or add-on type.

Unlike this, the touch panel TSP may be embedded in the display panel DISP. In other words, when manufacturing the display panel DISP, a plurality of touch electrodes and a plurality of touch routing lines constituting the touch panel TSP may be formed. The touch sensor structure, such as a plurality of touch electrodes and a plurality of touch routing lines, may be formed together with the electrodes and signal lines for display driving. Such touch panel TSP is referred to as an embedded type. In the following example, the touch panel TSP is formed in the embedded type for ease of description.

Figure 2:
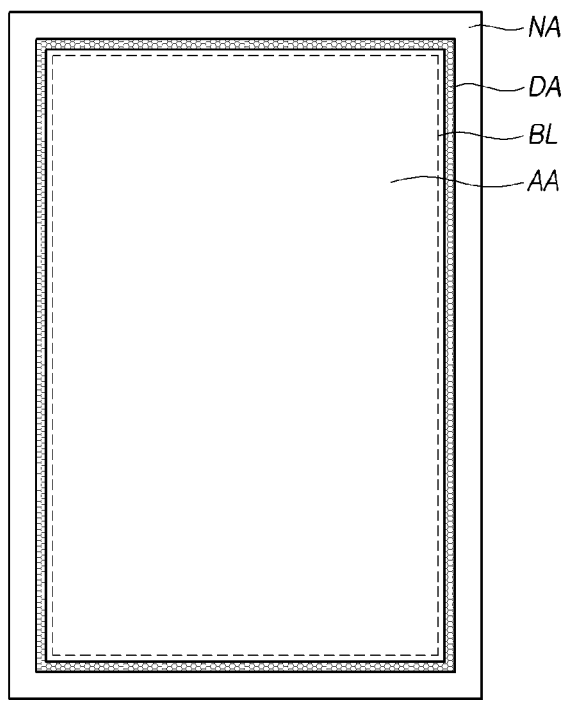
FIG. 2 is a view schematically illustrating a display panel of a touch display device according to aspects of the disclosure.

FIG. 2 is a view schematically illustrating a display panel DISP of a touch display device according to aspects of the disclosure.

Referring to FIG. 2, the display panel DISP may include a display area AA, where images are displayed, and a non-display area NA, which is an area around the outer boundary line BL of the display area AA.

In the display area AA of the display panel DISP, a plurality of subpixels for displaying images may be disposed, and various electrodes or signal lines for display driving may be disposed.

In the display area AA of the display panel DISP, a plurality of touch electrodes for touch sensing and a plurality of touch routing lines electrically connected with the touch electrodes may be disposed. Thus, the display area AA may also be referred to as a touch sensing area where touch sensing is possible.

In the non-display area NA of the display panel DISP, link lines, which are extensions of various signal lines disposed in the display area AA, or link lines electrically connected with various signal lines disposed in the display area AA may be disposed. Pins (or pads) electrically connected to the link lines may be disposed in the non-display area NA. A display driving circuit (e.g., the data driving circuit DDC or the gate driving circuit GDC) may be bonded or electrically connected to the pads disposed in the non-display area NA.

In the non-display area NA of the display panel DISP, link lines, which are extensions of a plurality of touch routing lines disposed in the display area AA, or link lines electrically connected with a plurality of touch routing lines disposed in the display area AA may be disposed. Pins (or pads) electrically connected to the link lines may be disposed in the non-display area NA of the display panel DISP. The pins (or pads) disposed in the non-display area NA may be electrically connected to the touch driving circuit TDC, or the touch driving circuit TDC may be bonded to the pins (or pads).

In the non-display area NA, partial extensions of the outermost touch electrodes among the plurality of touch electrodes disposed in the display area AA may be present, and one or more electrodes (touch electrodes) which are formed of the same material as the plurality of touch electrodes disposed in the display area AA may further be disposed.

In other words, the plurality of touch electrodes disposed on the display panel DISP may all be present in the display area AA, or some (e.g., the outermost touch electrodes) of the plurality of touch electrodes disposed in the display panel DISP may be present in the non-display area NA, or some (e.g., the outermost touch electrodes) of the plurality of touch electrodes disposed on the display panel DISP may be provided over the display area AA and the non-display area NA.

Referring to FIG. 2, according to an aspect, the display panel DISP of the touch display device may include a dam area DA where a dam DAM is placed to prevent any layer (e.g., the encapsulation layer in the organic light emitting display panel) from collapsing in the display area AA.

The dam area DA may be positioned at the border between the display area AA and the non-display area NA or at any point in the non-display area NA which is positioned around the display area AA.

The dam disposed in the dam area DA may be disposed to surround the display area AA in all directions or be disposed around only one or two or more portions (e.g., portions with a layer which may easily collapse) in the display area AA.

The dam disposed in the dam area DA may be constituted of a single continuous pattern or two or more dams separated from each other. Only a primary dam, two dams (the primary dam and a secondary dam), or three or more dams may be disposed in the dam area DA.

In the dam area DA, the primary dam may be present in any one direction, or the primary dam and the secondary dam all may be present in any one direction.

Figure 3:
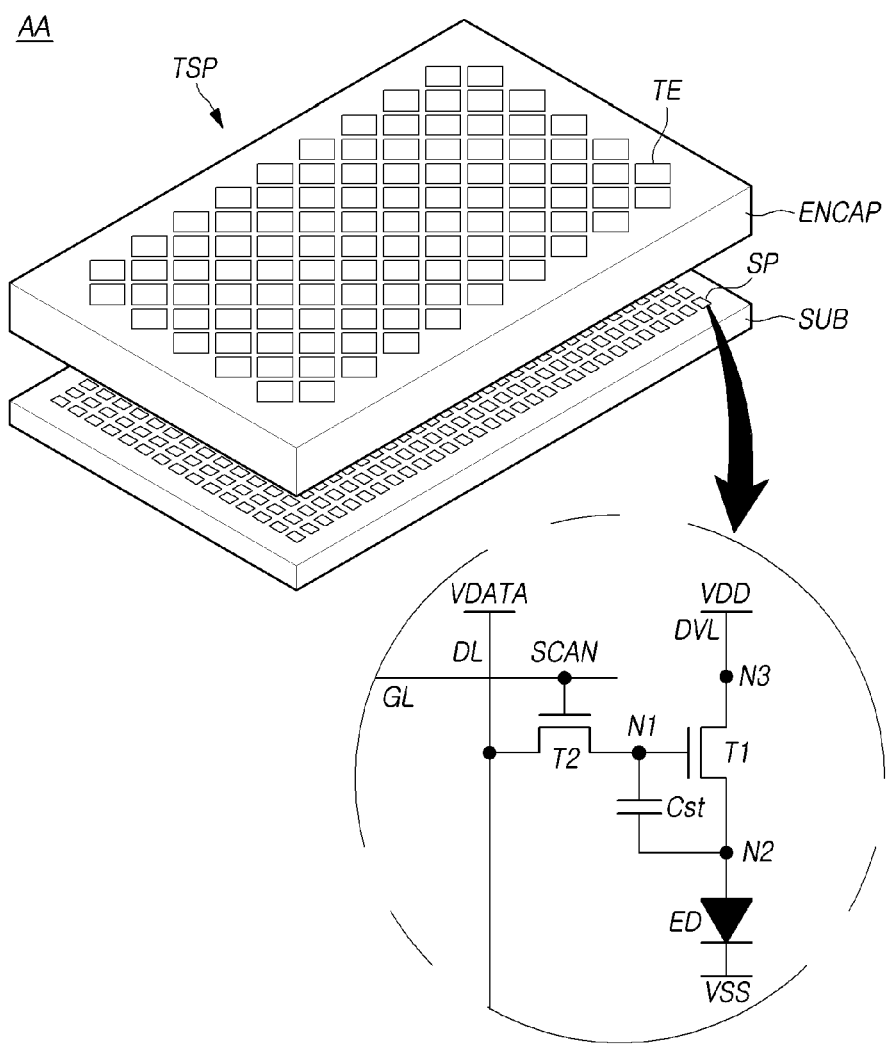
FIG. 3 is a view illustrating an example structure in which a touch panel is embedded in a display panel according to aspects of the disclosure.

FIG. 3 is a view illustrating an example structure in which a touch panel TSP is embedded in a display panel DISP according to an aspect.

Referring to FIG. 3, in the display area AA of the display panel DISP, a plurality of subpixels SP may be disposed on the substrate SUB.

Each of the plurality of subpixels SP may include a light emitting element ED, a first transistor T1 for driving the light emitting element, a second transistor T2 for transferring a data voltage VDATA to a first node N1 of the first transistor T1, and a storage capacitor Cst for maintaining a constant voltage during one frame.

The first transistor T1 may include the first node N1 to which the data voltage VDATA may be applied, a second node N2 electrically connected with the light emitting element ED, and a third node N3 to which a driving voltage VDD is applied from a driving voltage line DVL. The first node N1 may be a gate node, the second node N2 may be either a source node or a drain node, and the third node N3 may be the other of the source node and the drain node. The first transistor T1 is referred to as a driving transistor for driving the light emitting element ED.

The light emitting element ED may include a first electrode (e.g., an anode electrode), a light emitting layer, and a second electrode (e.g., a cathode electrode). The first electrode may be electrically connected with the second node N2 of the first transistor T1, and a base voltage VSS may be applied to the second electrode.

The light emitting layer in the light emitting element ED may be an organic light emitting layer containing an organic material. In this case, the light emitting element ED may be an organic light emitting diode (OLED).

The second transistor T2 may be on/off controlled by a scan signal SCAN applied via the gate line GL and be electrically connected between the first node N1 of the first transistor T1 and the data line DL. The second transistor T2 is referred to as a switching transistor.

If the second transistor T2 is turned on by the scan signal SCAN, the data voltage VDATA supplied from the data line DL is transferred to the first node N1 of the first transistor T1.

The storage capacitor Cst may be electrically connected between the first node N1 and second node N2 of the first transistor T1.

Each subpixel SP may have a 2T (transistor) 1C (capacitor) structure which includes two transistors T1 and T2 and one capacitor Cst as shown in FIG. 3 and, in some cases, each subpixel SP may further include one or more transistors or one or more capacitors.

The storage capacitor Cst may be not the parasitic capacitor (e.g., Cgs or Cgd), the internal capacitor which may be present between the first node N1 and second node N2 of the first transistor T1, but an external capacitor intentionally designed outside the first transistor T1.

Each of the first transistor T1 and the second transistor T2 may be an n-type transistor or a p-type transistor.

As described above, circuit elements, such as the light emitting element ED, two or more transistors T1 and T2, and one or more capacitors Cst, are disposed on the display panel DISP. Since such circuit elements (particularly, the light emitting element ED) are vulnerable to external moisture or oxygen, an encapsulation layer ENCAP may be disposed on the display panel DISP to prevent penetration of external moisture or oxygen into the circuit elements (particularly, the light emitting element ED).

The encapsulation layer ENCAP may be a single layer or may include multiple layers.

In the touch display device according to an aspect, the touch panel TSP may be formed on the encapsulation layer ENCAP.

In other words, in the touch display device, the touch sensor structure, e.g., the plurality of touch electrodes TE constituting the touch panel TSP, may be disposed on the encapsulation layer ENCAP.

Upon touch sensing, a touch driving signal or touch sensing signal may be applied to the touch electrode TE. Thus, upon touch sensing, an electric potential may be formed between the cathode electrode and the touch electrode TE disposed, with the encapsulation layer ENCAP interposed therebetween, causing unnecessary parasitic capacitance. Since the parasitic capacitance may deteriorate touch sensitivity, the distance between the touch electrode TE and the cathode electrode may be designed to be a predetermined value (e.g., 1am) or more considering, e.g., panel thickness, panel manufacturing process, and display performance, so as to reduce the parasitic capacitance. To that end, the thickness of the encapsulation layer ENCAP may be at least 1am or more, as an example.

Figure 4:
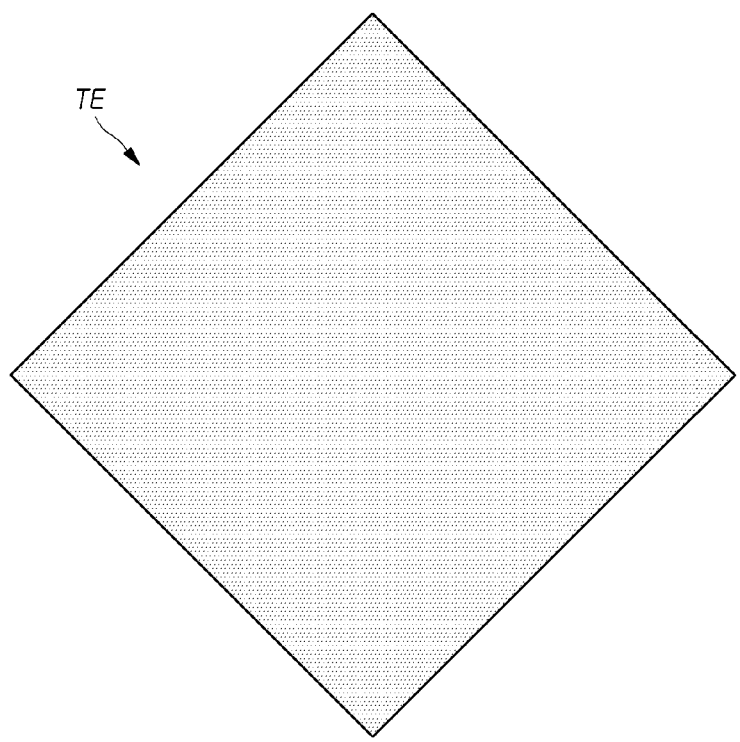
FIGS. 4 and 5 are views illustrating example types of touch electrodes disposed on a display panel according to aspects of the disclosure.
Figure 5:
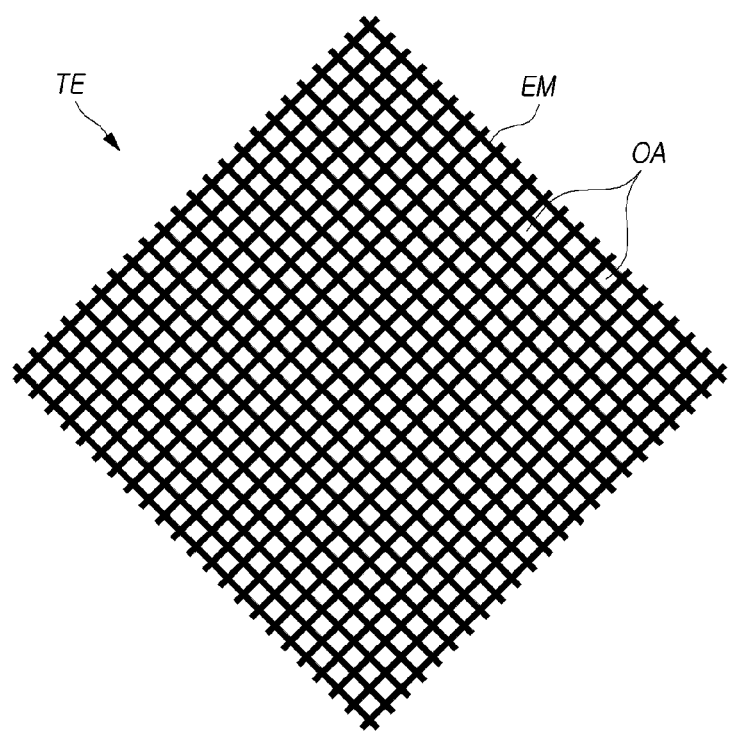

FIGS. 4 and 5 are views illustrating example types of touch electrodes TE disposed on a display panel DISP according to an aspect.

As shown in FIG. 4, each touch electrode TE disposed on the display panel DISP may be a plate-shape electrode with no opening. In this case, each touch electrode TE may be a transparent electrode. In other words, each touch electrode TE may be formed of a transparent electrode material to allow the light emitted from the plurality of subpixel SPs disposed thereunder to be transmitted upwards.

Unlike this, each touch electrode TE disposed on the display panel DISP may be an electrode metal EM with two or more openings OA, which is patterned in a mesh type.

The electrode metal EM is a part corresponding to the substantial touch electrode TE, to which the touch driving signal is applied or from which the touch sensing signal is detected.

As shown in FIG. 5, where each touch electrode TE is an electrode metal EM patterned in a mesh type, two or more openings OA may be present in the area of the touch electrode TE.

Each of the two or more openings OA present in each touch electrode TE may correspond to the light emitting area of one or more subpixels SP. In other words, the plurality of openings OA serve as a path along which the light emitted from the plurality of subpixels SP disposed thereunder are passed upwards. An example in which each touch electrode TE is a mesh-type electrode metal EM is described below for ease of description.

The electrode metal EM corresponding to each touch electrode TE may be positioned on the bank which is disposed in a non-light emitting area of the two or more subpixels SP.

As a method for forming several touch electrodes TE, after the electrode metal EM is formed broad in a mesh type, the electrode metal EM may be cut into a predefined pattern to electrically separate the electrode metal EM, forming several touch electrodes TE.

The contour of the touch electrode TE may be shaped as a diamond or rhombus as shown in FIGS. 4 and 5, or may come in other various shapes, such as a triangle, pentagon, or hexagon.

Figure 6:
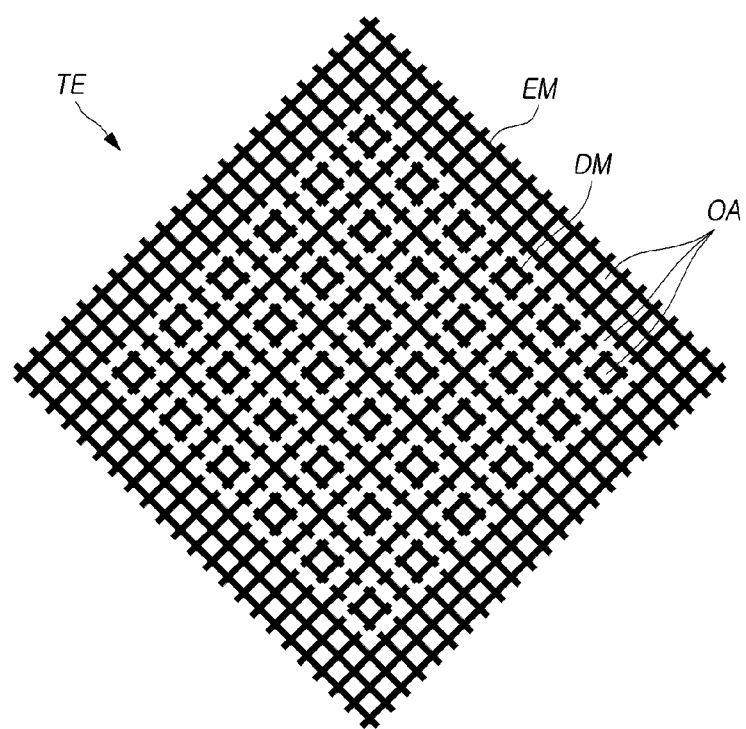
FIG. 6 is a view illustrating an example mesh-type touch electrode TE as shown in FIG. 5.

FIG. 6 is a view illustrating an example mesh-type touch electrode TE as shown in FIG. 5.

Referring to FIG. 6, in the area of each touch electrode TE, one or more dummy metals DM disconnected from the mesh-type electrode metal EM may be present.

The electrode metal EM is a part corresponding to the substantial touch electrode TE and is a part to which the touch driving signal is applied or from which the touch sensing signal is detected. The dummy metal DM, although present in the area of the touch electrode TE, has no touch driving signal applied thereto and no touch sensing signal detected therefrom. In other words, the dummy metal DM may be a metal electrically floated.

Thus, although the electrode metal EM is electrically connected with the touch driving circuit TDC, the dummy metal DM is not electrically connected with the touch driving circuit TDC.

In the area of each of all the touch electrodes TE, one or more dummy metals DM may be present, with them disconnected from the electrode metal EM.

Unlike this, only in the area of each of some of all the touch electrodes TE, one or more dummy metals DM may be present, with them disconnected from the electrode metal EM. In other words, in the area of some touch electrodes TE, no dummy metal DM may be present.

In relation to the role of the dummy metal DM, in the case where one or more dummy metals DM are absent and only the electrode metal EM is present in a mesh type in the area of the touch electrode TE as shown in FIG. 5, a visibility issue may arise in which the contour of the electrode metal EM is shown on the screen.

In contrast, where one or more dummy metals DM are present in the area of the touch electrode TE as shown in FIG. 6, the visibility issue that the contour of the electrode metal EM is shown on the screen may be prevented.

The magnitude of capacitance may be adjusted per touch electrode TE by adjusting the presence or absence of dummy metal DM or the number (dummy metal ratio) of dummy metals DM per touch electrode TE, thereby enhancing touch sensitivity.

The electrode metal EM formed in the area of one touch electrode TE may be cut at some spots, forming the dummy metals DM. In other words, the electrode metal EM and the dummy metal DM may be formed of the same material on the same layer.

According to an aspect, the touch display device may sense touches based on the capacitance formed at the touch electrode TE.

The touch display device according to aspects of the disclosure may sense a touch in a mutual capacitance-based touch sensing scheme or self capacitance-based touch sensing scheme, as the capacitance-based touch sensing scheme.

In the mutual-capacitance-based touch sensing scheme, the plurality of touch electrodes TE may be divided into a driving touch electrode (transmission touch electrode) to which the touch driving signal is applied and a sensing touch electrode (reception touch electrode) from which the touch sensing signal is detected and which forms a capacitance with the driving touch electrode.

In the mutual-capacitance-based touch sensing scheme, the touch sensing circuit TSC senses whether there is a touch and/or the coordinates of a touch based on variations in the capacitance (mutual-capacitance) between the driving touch electrode and the sensing touch electrode according to whether there is a pointer, such as a finger or pen.

In the self-capacitance-based touch sensing scheme, each touch electrode TE plays a role both as a driving touch electrode and as a sensing touch electrode. In other words, the touch sensing circuit TSC applies the touch driving signal to one or more touch electrodes TE, detects the touch sensing signal via the touch electrode TE to which the touch driving signal has been applied, grasps a variation in the capacitance between the touch electrode TE and the pointer, e.g., a finger or pen, based on the detected touch sensing signal, and senses whether there is a touch and/or the coordinates of a touch. In the self-capacitance-based touch sensing scheme, the driving touch electrode and the sensing touch electrode are not distinguished from each other.

As such, the touch display device according to aspects of the disclosure may sense a touch in the mutual capacitance-based touch sensing scheme or self capacitance-based touch sensing scheme. In the following example, the touch display device performs mutual-capacitance-based touch sensing and has a touch sensor structure for the same, for ease of description.

Figure 7:
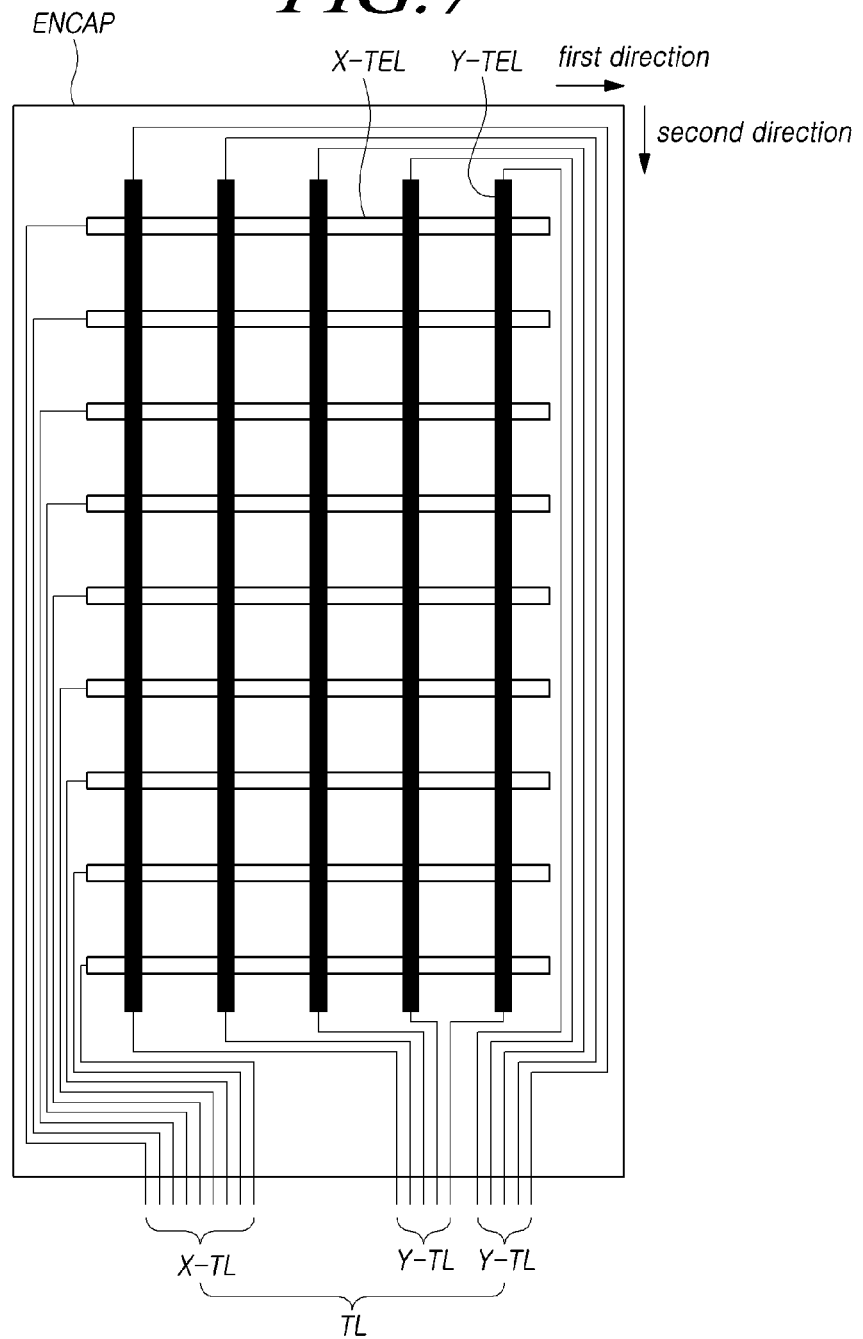
FIG. 7 is a view schematically illustrating a touch sensor structure in a display panel according to aspects of the disclosure.
Figure 8:
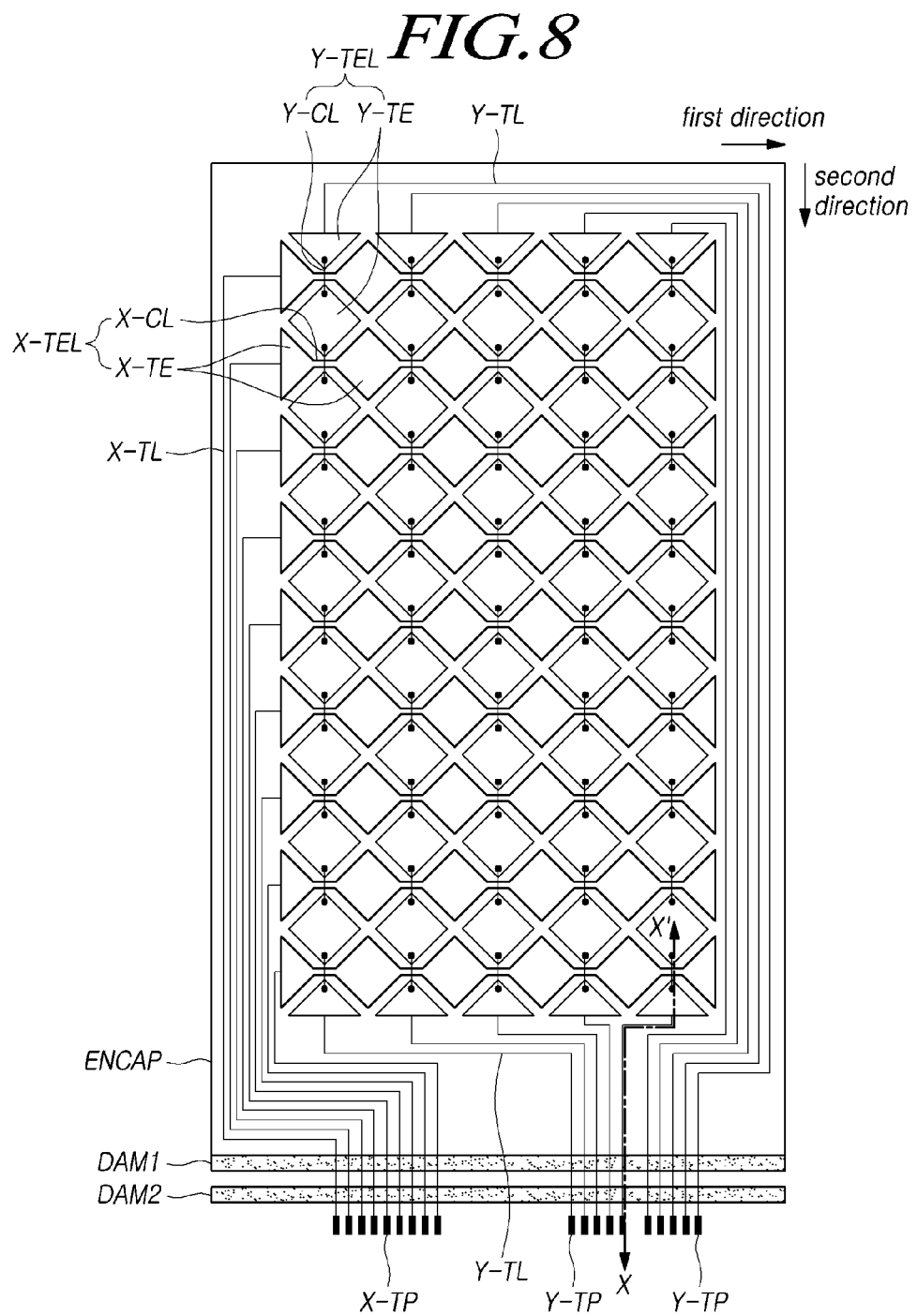
FIG. 8 is a view illustrating an example touch sensor structure as shown in FIG. 7.

FIG. 7 is a view schematically illustrating a touch sensor structure in a display panel DISP according to an aspect. FIG. 8 is a view illustrating an example touch sensor structure as shown in FIG. 7.

Referring to FIG. 7, a touch sensor structure for mutual-capacitance-based touch sensing may include a plurality of X-touch electrode lines X-TEL and a plurality of Y-touch electrode lines Y-TEL. The plurality of X-touch electrode lines X-TEL and the plurality of Y-touch electrode lines Y-TEL are positioned on the encapsulation layer ENCAP.

Each of the plurality of X-touch electrode lines X-TEL may be disposed in a first direction, and each of the plurality of Y-touch electrode lines Y-TEL may be disposed in a second direction different from the first direction.

In the disclosure, the first direction and the second direction may be relatively different directions. As an example, the first direction may be the x-axis direction, and the second direction may be the y-axis direction. In contrast, the first direction may be the y-axis direction, and the second direction may be the x-axis direction. The first direction and the second direction may be, or may not be, perpendicular to each other. In the disclosure, row and column are relative terms, and from a point of view, the terms "row" and "column" may be interchangeably used.

Each of the X-touch electrode lines X-TEL may be constituted of a plurality of X-touch electrodes X-TE electrically connected with each other. Each of the Y-touch electrode lines Y-TEL may be constituted of a plurality of Y-touch electrodes Y-TE electrically connected with each other.

The plurality of X-touch electrodes X-TE and the plurality of Y-touch electrodes Y-TE are electrodes which are included in the plurality of touch electrodes TE and have separate roles (functions) from each other.

For example, the plurality of X-touch electrodes X-TE constituting each of the plurality of X-touch electrode lines X-TEL may be driving touch electrodes, and the plurality of Y-touch electrodes Y-TE constituting each of the plurality of Y-touch electrode lines Y-TEL may be sensing touch electrodes. In this case, each of the plurality of X-touch electrode lines X-TEL corresponds to the driving touch electrode line, and each of the plurality of Y-touch electrode lines Y-TEL corresponds to the sensing touch electrode line.

In contrast, the plurality of X-touch electrodes X-TE constituting each of the plurality of X-touch electrode lines X-TEL may be sensing touch electrodes, and the plurality of Y-touch electrodes Y-TE constituting each of the plurality of Y-touch electrode lines Y-TEL may be driving touch electrodes. In this case, each of the plurality of X-touch electrode lines X-TEL corresponds to the sensing touch electrode line, and each of the plurality of Y-touch electrode lines Y-TEL corresponds to the driving touch electrode line.

Hereinafter, for convenience of description, it is assumed that the X-touch electrode X-TE is a driving touch electrode, and the Y-touch electrode Y-TE is a sensing touch electrode. However, aspects of the disclosure are not limited thereto.

A touch sensor metal TSM for touch sensing may include a plurality of touch routing lines TL as well as the plurality of X-touch electrode lines X-TEL and the plurality of Y-touch electrode lines Y-TEL.

The plurality of touch routing lines TL may include one or more X-touch routing lines X-TL connected with each of the plurality of X-touch electrode lines X-TEL and one or more Y-touch routing lines Y-TL connected with each of the plurality of Y-touch electrode lines Y-TEL.

Referring to FIG. 8, each of the plurality of X-touch electrode lines X-TEL may include a plurality of X-touch electrodes X-TE disposed in the same row (or column) and one or more X-touch electrode connection lines X-CL electrically connecting the same. The X-touch electrode connection line X-CL connecting two adjacent X-touch electrodes X-TE may be a metal integrated with two adjacent X-touch electrodes X-TE (the example of FIG. 8) or be a metal connected with two adjacent X-touch electrodes X-TE via a contact hole.

Each of the plurality of Y-touch electrode lines Y-TEL may include a plurality of Y-touch electrodes Y-TE disposed in the same column (or row) and one or more Y-touch electrode connection lines Y-CL electrically connecting the same. The Y-touch electrode connection line Y-CL connecting two adjacent Y-touch electrodes Y-TE may be a metal integrated with two adjacent Y-touch electrodes Y-TE or be a metal connected with two adjacent Y-touch electrodes Y-TE via a contact hole (the example of FIG. 8).

In the crossing area (touch electrode line crossing area) of the X-touch electrode line X-TEL and the Y-touch electrode line Y-TEL, the X-touch electrode connection line X-CL and the Y-touch electrode connection line Y-CL may cross each other.

In this case, in the crossing area (touch electrode line crossing area) of the X-touch electrode line X-TEL and the Y-touch electrode line Y-TEL, the X-touch electrode connection line X-CL and the Y-touch electrode connection line Y-CL may cross each other.

As such, where the X-touch electrode connection line X-CL and the Y-touch electrode connection line Y-CL cross each other in the touch electrode line crossing area, the X-touch electrode connection line X-CL and the Y-touch electrode connection line Y-CL may be needed to be placed on different layers.

Thus, to cross the plurality of X-touch electrode lines X-TEL and the plurality of Y-touch electrode lines Y-TEL, the plurality of X-touch electrodes X-TE, the plurality of X-touch electrode connection lines X-CL, the plurality of Y-touch electrodes Y-TE, the plurality of Y-touch electrode lines Y-TEL, and the plurality of Y-touch electrode connection lines Y-CL may be positioned on two or more layers.

Referring to FIG. 8, each of the plurality of X-touch electrode lines X-TEL is electrically connected with the corresponding X-touch pad X-TP via one or more X-touch routing lines X-TL. In other words, the outermost X-touch electrode X-TE among the plurality of X-touch electrodes X-TE included in one X-touch electrode line X-TEL is electrically connected with the X-touch pad X-TP via the X-touch routing line X-TL.

Each of the plurality of Y-touch electrode lines Y-TEL is electrically connected with the corresponding Y-touch pad Y-TP via one or more Y-touch routing lines Y-TL. In other words, the outermost Y-touch electrode Y-TE among the plurality of Y-touch electrodes Y-TE included in one Y-touch electrode line Y-TEL is electrically connected with the Y-touch pad Y-TP via the Y-touch routing line Y-TL.

As shown in FIG. 8, the plurality of X-touch electrode lines X-TEL and the plurality of Y-touch electrode lines Y-TEL may be disposed on the encapsulation layer ENCAP. In other words, the plurality of X-touch electrode connection lines X-CL and the plurality of X-touch electrodes X-TE constituting the plurality of X-touch electrode lines X-TEL may be disposed on the encapsulation layer ENCAP. The plurality of Y-touch electrode connection lines Y-CL and the plurality of Y-touch electrodes Y-TE constituting the plurality of Y-touch electrode lines Y-TEL may be disposed on the encapsulation layer ENCAP.

As shown in FIG. 8, each of the plurality of X-touch routing lines X-TL electrically connected with the plurality of X-touch electrode lines X-TEL may be disposed on the encapsulation layer ENCAP and extend up to where the encapsulation layer ENCAP is absent, and be electrically connected with the plurality of X-touch pads X-TP. Each of the plurality of Y-touch routing lines Y-TL electrically connected with the plurality of Y-touch electrode lines Y-TEL may be disposed on the encapsulation layer ENCAP and extend up to where the encapsulation layer ENCAP is absent, and be electrically connected with the plurality of Y-touch pads Y-TP. The encapsulation layer ENCAP may be positioned in the display area AA and, in some cases, may extend up to the non-display area NA.

As described above, to prevent any layer (e.g., the encapsulation layer in the OLED panel) in the display area AA from collapsing, the dam area DA may be present in the border area between the display area AA and the non-display area NA or in the non-display area NA which is positioned around the display area AA.

As shown in FIG. 8, a primary dam DAM1 and a secondary dam DAM2 may be disposed in the dam area DA (refer to FIG. 2), as an example. The secondary dam DAM2 may be positioned further outside the primary dam DAM1.

Unlike in the example shown in FIG. 8, only the primary dam DAM1 may be positioned in the dam area DA or, in some cases, one or more dams may be disposed in addition to the primary dam DAM1 and the secondary dam DAM2.

Referring to FIG. 8, the encapsulation layer ENCAP may be positioned on a side of the primary dam DAM1 or be positioned on the top as well as on a side of the primary dam DAM1.

Figure 9:
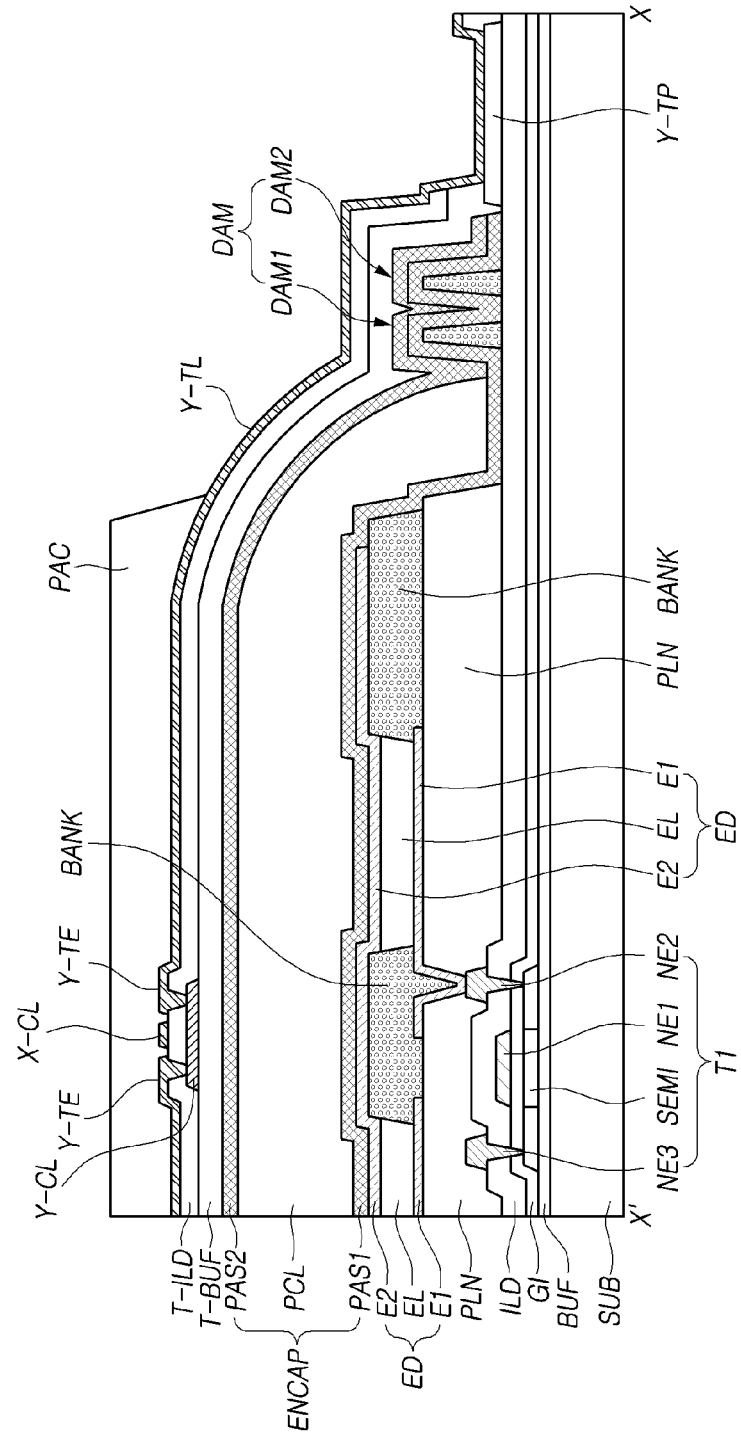
FIG. 9 is a cross-sectional view illustrating a portion of a display panel, taken along line X-X' of FIG. 8, according to aspects of the disclosure.

FIG. 9 is a cross-sectional view illustrating a portion of a display panel DISP, taken along line X-X' of FIG. 8, according to aspects of the disclosure.

FIG. 9 illustrates a plate-shaped touch electrode TE, but this is merely an example. For example, a mesh-type touch electrode TE may be used. Where the touch electrode TE comes in a mesh type, the opening OA of the touch electrode TE may be positioned on the light emitting area of the subpixel SP.

In each subpixel SP in the display area AA, the first transistor T1, which is the driving transistor, is disposed on the substrate SUB.

The first transistor T1 includes a first node electrode NE1, which corresponds to the gate electrode, a second node electrode NE2, which corresponds to the source electrode or drain electrode, a third node electrode NE3, which corresponds to the drain electrode or source electrode, and a semiconductor layer SEMI.

The first node electrode NE1 and the semiconductor layer SEMI may overlap with each other, with a gate insulation film GI disposed therebetween. The second node electrode NE2 may be formed on an insulation layer ILD to contact one side of the semiconductor layer SEMI, and the third node electrode NE3 may be formed on the insulation layer ILD to contact the other side of the semiconductor layer SEMI.

The light emitting element ED may include a first electrode E1, which corresponds to the anode electrode (or cathode electrode), a light emitting layer EL formed on the first electrode E1, and a second electrode E2 formed on the light emitting layer EL and corresponding to the cathode electrode (or anode electrode).

The first electrode E1 is electrically connected with the second node electrode NE2 of the first transistor T1, exposed through a pixel contact hole which passes through a planarization film PLN.

The light emitting layer EL is formed on the first electrode E1 in an emission area prepared by a bank BANK. The light emitting layer EL is formed in the order of hole-related layer, light emitting layer, and electron-related layer, or its reverse order, on the first electrode E1. The second electrode E2 is formed to face the first electrode E1, with the light emitting layer EL disposed therebetween.

The encapsulation layer ENCAP blocks penetration of external moisture or oxygen into the light emitting element ED which is vulnerable to external moisture or oxygen.

The encapsulation layer ENCAP may be a single layer or may include a plurality of layers PAS1, PCL, and PAS2 as shown in FIG. 9.

For example, where the encapsulation layer ENCAP is formed of multiple layers PAS1, PCL, and PAS2, the encapsulation layer ENCAP may include one or more inorganic encapsulation layers PAS1 and PAS2 and one or more organic encapsulation layer PCL. As a specific example, the encapsulation layer ENCAP may have a structure in which a first inorganic encapsulation layer PAS1, an organic encapsulation layer PCL, and a second inorganic encapsulation layer PAS2 are sequentially stacked.

The organic encapsulation layer PCL may further include at least one organic encapsulation layer or at least one inorganic encapsulation layer.

The first inorganic encapsulation layer PAS1 is formed on the substrate SUB where the second electrode E2 corresponding to the cathode electrode is formed, to be positioned most adjacent to the light emitting element ED. The first inorganic encapsulation layer PAS1 is formed of an inorganic insulation material capable of low-temperature deposition, such as, e.g., silicon nitride (SiNx), silicon oxide (SiOx), silicon oxynitride (SiON) and aluminum oxide ($Al_2O_3$). Since the first inorganic encapsulation layer PAS1 is deposed at low-temperature atmosphere, the first inorganic encapsulation layer PAS1 may prevent damage to the light emitting layer EL including the organic material vulnerable to high-temperature atmosphere upon deposition.

The organic encapsulation layer PCL may have a smaller area than the first inorganic encapsulation layer PAS1 and, in this case, the organic encapsulation layer PCL may be formed to expose two opposite ends of the first inorganic encapsulation layer PAS1. The organic encapsulation layer PCL serves to mitigate stress between the layers due to a warping of the touch display device which is an OLED device, while reinforcing the planarization performance. The organic encapsulation layer PCL may be formed of, e.g., an acrylic resin, epoxy resin, polyimide, polyethylene, silicon oxycarbide (SiOC), or other organic insulation materials.

Where the organic encapsulation layer PCL is formed in an inkjet method, one or two dams DAM may be formed in the border area between the non-display area NA and the display area AA or the dam area DA which is a portion of the non-display area NA.

For example, as shown in FIG. 9, the dam area DA may be positioned between the display area AA and the pad area, where the plurality of X-touch pads X-TP and the plurality of Y-touch pads Y-TP are formed in the non-display area NA and, in the dam area DA, a primary dam DAM1 adjacent to the display area AA and a secondary dam DAM2 adjacent to the pad area may be present.

The one or more dams DAM disposed in the dam area DA may prevent the liquid-state organic encapsulation layer PCL from collapsing to the non-display area NA and resultantly penetrating into the pad area when the liquid-phase organic encapsulation layer PCL is dropped to the display area AA.

This effect may be increased when the primary dam DAM1 and the secondary dam DAM2 are provided as shown in FIG. 9.

The primary dam DAM1 and/or the secondary dam DAM2 may be formed in a single-layer structure or multi-layer structure. For example, the primary dam DAM1 and/or the secondary dam DAM2 may simultaneously be formed of the same material as at least one of the bank BANK and a spacer (not shown). In this case, a dam structure may be formed without a masking process or cost rise.

The primary dam DAM1 and/or the secondary dam DAM2 may be structured so that the first inorganic encapsulation layer PAS1 and/or the second inorganic encapsulation layer PAS2 are stacked on the bank BANK as shown in FIG. 9.

The organic encapsulation layer PCL including an organic material may be positioned only on an inside surface of the primary dam DAM1 as shown in FIG. 9.

Unlike this, the organic encapsulation layer PCL containing an organic material may also be positioned on the top of at least a portion of the primary dam DAM1 and the secondary dam DAM2. As an example, the organic encapsulation layer PCL may also be positioned on the top of the primary dam DAM1.

The second inorganic encapsulation layer PAS2 may be formed over the substrate SUB, where the organic encapsulation layer PCL is formed, to cover the upper surface and side surfaces of each of the organic encapsulation layer PCL and the first inorganic encapsulation layer PAS1. The second inorganic encapsulation layer PAS2 minimizes or blocks penetration of external moisture or oxygen into the first inorganic encapsulation layer PAS1 and the organic encapsulation layer PCL. The second inorganic encapsulation layer PAS2 is formed of an inorganic insulation material, such as, e.g., silicon nitride (SiNx), silicon oxide (SiOx), silicon oxynitride (SiON) and aluminum oxide ($Al_2O_3$).

A touch buffer film T-BUF may be disposed on the encapsulation layer ENCAP. The touch buffer film T-BUF may be positioned between the second electrode E2 of the light emitting element ED and the touch sensor metal TSM including the X-touch electrodes X-TE, the Y-touch electrodes Y-TE, the X-touch electrode connection lines X-CL, and the Y-touch electrode connection lines Y-CL.

The touch buffer film T-BUF may be designed to maintain a predetermined minimum spacing (e.g., 1 μm) between the touch sensor metal TSM and the second electrode E2 of the light emitting element ED. Thus, it is possible to reduce or prevent the parasitic capacitance formed between the touch sensor metal TSM and the second electrode E2 of the light emitting element ED and hence prevent deterioration of touch sensitivity due to parasitic capacitance.

It is also possible to place the touch sensor metal TSM including the X-touch electrodes X-TE, the Y-touch electrodes Y-TE, the X-touch electrode connection lines X-CL, and the Y-touch electrode connection lines Y-CL, on the encapsulation layer ENCAP, without the touch buffer film T-BUF.

The touch buffer film T-BUF may block off penetration, into the organic material-containing light emitting layer EL, of external moisture or the chemical (e.g., developer or etchant) used upon manufacturing the touch sensor metal TSM disposed on the touch buffer film T-BUF. Thus, the touch buffer film T-BUF may prevent damage to the light emitting layer EL vulnerable to chemicals or moisture.

The touch buffer film T-BUF is formed of an organic insulation material with a low permittivity of 1 to 3 and formed at a low temperature which is not more than a predetermined temperature (e.g., 100° C.) to prevent damage to the light emitting layer EL containing the organic material vulnerable to high temperature. For example, the touch buffer film T-BUF may be formed of an acrylic-based, epoxy-based, or siloxane-based material. The touch buffer film T-BUF with planarizability, formed of an organic insulation material, may prevent fracture of the touch sensor metal TSM formed on the touch buffer film T-BUF and damage to each layer PAS1, PCL, and PAS2 included in the encapsulation layer ENCAP due to a warping of the OLED device.

According to a mutual-capacitance-based touch sensor structure, the X-touch electrode line X-TEL and the Y-touch electrode line Y-TEL may be formed on the touch buffer film T-BUF, and the X-touch electrode line X-TEL and the Y-touch electrode line Y-TEL may be disposed to cross each other.

The Y-touch electrode line Y-TEL may include the plurality of Y-touch electrodes Y-TE and the plurality of Y-touch electrode connection lines Y-CL electrically connecting the plurality of Y-touch electrodes Y-TE.

As shown in FIG. 9, the plurality of Y-touch electrodes Y-TE and the plurality of Y-touch electrode connection lines Y-CL may be positioned on different layers, with a touch insulation film T-ILD disposed therebetween.

The plurality of Y-touch electrodes Y-TE may be spaced apart at a predetermined interval along the y axis direction. Each of the plurality of Y-touch electrodes Y-TE may be electrically connected with another Y-touch electrode Y-TE adjacent thereto in the y axis direction via the Y-touch electrode connection line Y-CL.

The Y-touch electrode connection line Y-CL may be formed on the touch buffer film T-BUF and be exposed via the touch contact hole passing through the touch insulation film T-ILD and be electrically connected with two Y-touch electrodes Y-TE adjacent in the y axis direction.

The Y-touch electrode connection line Y-CL may be disposed to overlap with the bank BANK. Thus, it is possible to prevent a reduction in the aperture ratio due to the Y-touch electrode connection line Y-CL.

The X-touch electrode line X-TEL may include the plurality of X-touch electrodes X-TE and the plurality of X-touch electrode connection lines X-CL electrically connecting the plurality of X-touch electrodes X-TE. The plurality of X-touch electrodes X-TE and the plurality of X-touch electrode connection lines X-CL may be positioned on different layers, with a touch insulation film T-ILD disposed therebetween.

The plurality of X-touch electrodes X-TE may be spaced apart at a predetermined interval along the x axis direction, on the touch insulation film T-ILD. Each of the plurality of X-touch electrodes X-TE may be electrically connected with another X-touch electrode X-TE adjacent thereto in the x axis direction via the X-touch electrode connection line X-CL.

The X-touch electrode connection line X-CL may be disposed on the same plane as the X-touch electrode X-TE and be electrically connected with two X-touch electrodes X-TE adjacent thereto in the x axis direction without a separate contact hole or be integrated with the two X-touch electrodes X-TE adjacent thereto each other in the x axis direction.

The X-touch electrode connection line X-CL may be disposed to overlap with the bank BANK. Thus, it is possible to prevent a reduction in the aperture ratio due to the X-touch electrode connection line X-CL.

The Y-touch electrode line Y-TEL may be electrically connected with the touch driving circuit TDC via the Y-touch routing line Y-TL and the Y-touch pad Y-TP. Likewise, the X-touch electrode line X-TEL may be electrically connected with the touch driving circuit TDC via the X-touch routing line X-TL and the X-touch pad X-TP.

A pad cover electrode may be further provided to cover the X-touch pad X-TP and the Y-touch pad Y-TP.

The X-touch pad X-TP may be formed separately from the X-touch routing line X-TL or may extend from the X-touch routing line X-TL. The Y-touch pad Y-TP may be formed separately from the Y-touch routing line Y-TL or may extend from the Y-touch routing line Y-TL.

Where the X-touch pad X-TP extends from the X-touch routing line X-TL, and the Y-touch pad Y-TP extends from the Y-touch routing line Y-TL, the X-touch pad X-TP, the X-touch routing line X-TL, the Y-touch pad Y-TP, and the Y-touch routing line Y-TL may be formed of the same first conductive material. The first conductive material may be formed in a single-layer or multi-layer structure using a metal with good corrosion or acid resistance or electric conductivity, such as Al, Ti, Cu, and Mo.

For example, the X-touch pad X-TP, X-touch routing line X-TL, Y-touch pad Y-TP, and Y-touch routing line Y-TL formed of the first conductive material may be formed in a three-layer stacked structure, such as Ti/Al/Ti and Mo/Al/Mo.

The pad cover electrode capable of covering the X-touch pad X-TP and Y-touch pad Y-TP may be formed of a second conductive material which is the same material as the X-touch electrode and Y-touch electrode X-TE and Y-TE. The second conductive material may be formed of a transparent conductive material, such as ITO and IZO, which has high corrosion or acid resistance. The pad cover electrode may be formed to be exposed by the touch buffer film T-BUF and be thus bonded with the touch driving circuit TDC or a circuit film where the touch driving circuit TDC is mounted.

The touch buffer film T-BUF may be formed to cover the touch sensor metal TSM, preventing corrosion to the touch sensor metal TSM by external moisture. As an example, the touch buffer film T-BUF may be formed of an organic insulation material or as a circular polarizer or epoxy or acrylic film. The touch buffer film T-BUF on the encapsulation layer ENCAP may be omitted. In other words, the touch buffer film T-BUF may not be an essential component.

The Y-touch routing line Y-TL may be electrically connected with the Y-touch electrode via the touch routing line contact hole or be integrated with the Y-touch electrode Y-TE.

The Y-touch routing line Y-TL may extend up to the non-display area NA and be electrically connected with the Y-touch pad Y-TP via the top and side of the encapsulation layer ENCAP and the top and side of the dam DAM. Thus, the Y-touch routing line Y-TL may be electrically connected with the touch driving circuit TDC via the Y-touch pad Y-TP.

The Y-touch routing line Y-TL may transfer the touch sensing signal from the Y-touch electrode Y-TE to the touch driving circuit TDC or may receive the touch driving signal from the touch driving circuit TDC and transfer the touch driving signal to the Y-touch electrode Y-TE.

The X-touch routing line X-TL may be electrically connected with the X-touch electrode X-TE via the touch routing line contact hole or may be integrated with the X-touch electrode X-TE.

The X-touch routing line X-TL may extend up to the non-display area NA and be electrically connected with the X-touch pad X-TP via the top and side of the encapsulation layer ENCAP and the top and side of the dam DAM. Thus, the X-touch routing line X-TL may be electrically connected with the touch driving circuit TDC via the X-touch pad X-TP.

The X-touch routing line X-TL may receive the touch driving signal form the touch driving circuit TDC and transfer the touch driving signal to the X-touch electrode X-TE and may transfer the touch sensing signal from the X-touch electrode X-TE to the touch driving circuit TDC.

The arrangement of the X-touch routing line X-TL and the Y-touch routing line Y-TL may be varied depending on panel design specifications.

A touch protection film PAC may be disposed on the X-touch electrode X-TE and the Y-touch electrode Y-TE. The touch protection film PAC may extend up to before or after the dam DAM and may thus be disposed even on the X-touch routing line X-TL and the Y-touch routing line Y-TL.

The cross-sectional view of FIG. 9 illustrates a conceptual structure. Depending on the direction or position in which it is viewed, the position, thickness, or width of each pattern (e.g., various layers or electrodes) may be varied, and the connection structure of various patterns may be varied, and an additional layer other than the layers shown may be present as well, or some of the layers may be omitted or combined. For example, the width of the bank BANK may be narrower than that shown in the drawings, and the height of the dam DAM may be higher or lower than shown. In FIG. 9, the touch electrode TE or touch routing line TL is overall disposed on the subpixel SP to represent an example structure of being connected to the touch pad TP along the inclined surface of the encapsulation layer ENCAP and the touch routing line TL. However, if the touch electrode TE is formed in the above-described mesh type, the opening OA of the touch electrode TE may be positioned on the light emitting area of the subpixel SP. A color filter CF may be disposed on the encapsulation layer ENCAP. The color filter CF may be positioned on the touch electrode TE or between the encapsulation layer ENCAP and the touch electrode TE.

Figure 10:
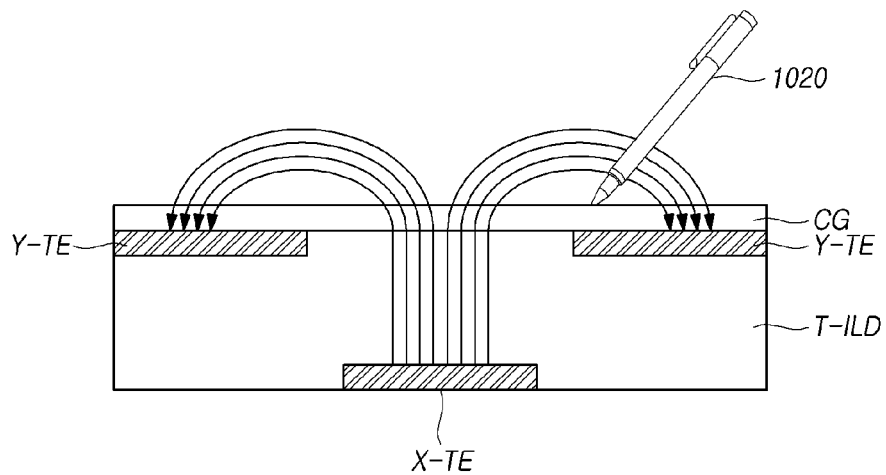
FIG. 10 is a view schematically illustrating a principle of sensing a touch by a touch object in a touch display device according to aspects of the disclosure.

FIG. 10 is a view schematically illustrating a principle of sensing a touch by a touch object 410 in a touch display device according to aspects of the disclosure.

Referring to FIG. 10, in the touch display device according to aspects of the disclosure, an electric field may be formed between the X-touch electrode X-TE and the Y-touch electrodes Y-TE by a pulse-type touch driving signal input to the X-touch electrode.

From a circuit point of view, it corresponds to a capacitor having the X-touch electrode X-TE and the Y-touch electrode Y-TE as two ends thereof.

The X-touch electrode X-TE and the Y-touch electrode Y-TE may be positioned on different layers, with the touch insulation film T-ILD disposed therebetween. In some cases, the X-touch electrode X-TE and the Y-touch electrode Y-TE may be positioned on the same layer.

If the touch object 1020 approaches the touch display device, a portion of the electric field is directed toward the touch object 1020 from the X-touch electrode X-TE.

The touch object 1020 may include a conductor, such as a human finger or a stylus. The touch object 1020 may be a passive-type stylus or an active-type stylus.

Accordingly, the density of the electric field directed from the X-touch electrode X-TE to the Y-touch electrode Y-TE decreases, and the voltage value of the Y-touch electrode Y-TE changes.

The touch sensing circuit may sense whether there is a touch and/or a touch position based on the changed voltage value of the Y-touch electrode Y-TE.

Accordingly, the touch object 1020 should come close to the X-touch electrode X-TE, enough to be able to at least a portion of the electric field formed between the X-touch electrode X-TE and the Y-touch electrode Y-TE.

Referring to FIG. 10, a cover glass CG may be disposed on the X-touch electrode X-TE and the Y-touch electrode Y-TE. The touch object 1020 should come close to the X-touch electrode X-TE enough to contact the cover glass CG, for example.

Accordingly, it is difficult for the touch object 1020 positioned far away from the X-touch electrode X-TE to absorb the electric field. Accordingly, it is limited to implement a so-called "hover touch (hovering touch)" function that enables touch sensing even at a position far away from the X-touch electrode X-TE.

When a pulse-type touch driving signal having a high voltage is input to the X-touch electrode X-TE to implement the hover touch function, the strength of the electric field may be increased, but power consumption may be increased.

Although not shown, there may be a method to further increase the direction of the electric field in the vertical direction by disposing a layer to which power is supplied under the X-touch electrode X-TE to implement the hover touch function. However, this method also has a problem in that power is consumed in the corresponding layer, resulting in increased power consumption.

Accordingly, it is a technical objective to provide a touch display device capable of reducing power consumption while providing the hover touch function.

Figure 11:
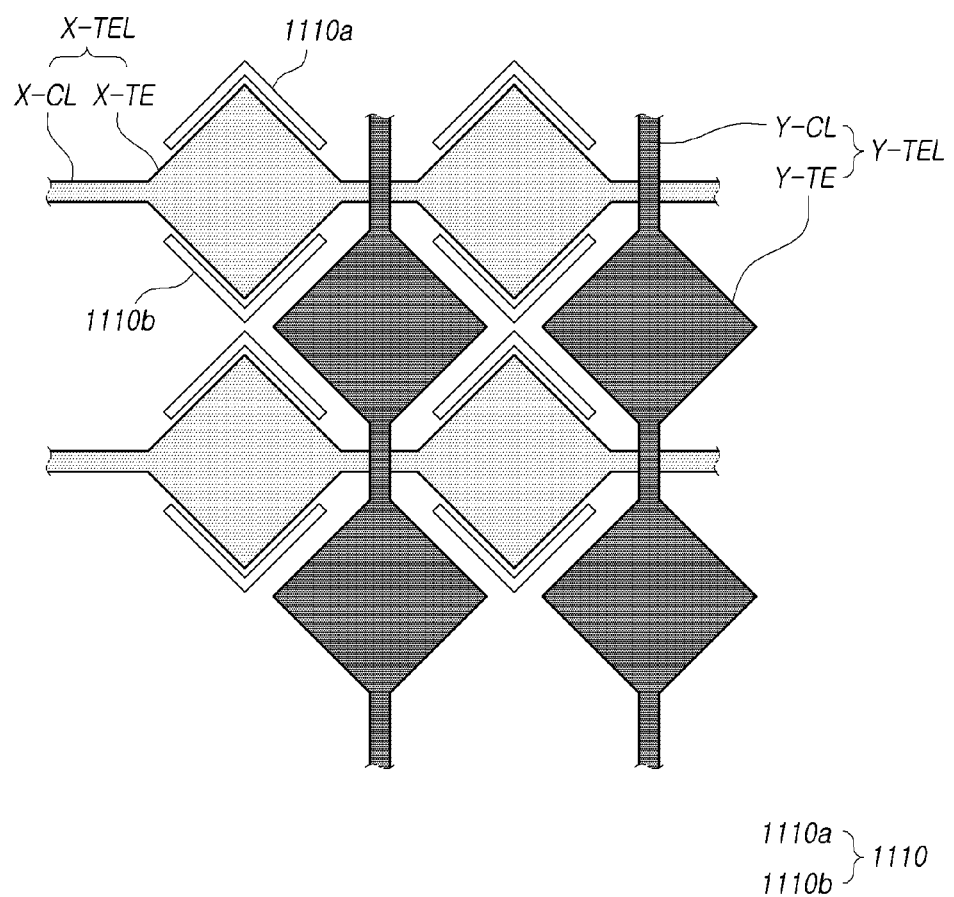
FIG. 11 is a front view illustrating a touch display device having a magnetic substance along an edge of a touch electrode according to aspects of the disclosure.

FIG. 11 is a front view illustrating a touch display device having a magnetic substance along an edge of a touch electrode TE according to aspects of the disclosure.

Referring to FIG. 11, the touch display device according to aspects of the disclosure may include a magnetic substance 1110 surrounding the touch electrode TE. The magnetic substance 1110 refers to an object having magnetism.

The magnetic substance 1110 may be disposed to surround the touch electrode to which a pulse-type touch driving signal is input.

The magnetic substance 1110 may be an integrated, L-shaped magnet or be a magnetic material patterned around the touch electrode (e.g., the X-touch electrode X-TE) in an area on the touch electrode.

When the magnetic substance 1110 is patterned around the touch electrode, the magnetic substance may be patterned on the protection film PAC (shown in FIG. 9 described above) or may be patterned on a separate substrate (not shown) (shown in FIG. 17 as substrate SUB2) from the protection film PAC, so that the substrate where the magnetic substance 1110 is patterned may be coupled with the display panel.

A method for forming the magnetic substance 1110 on a substrate may be to, after patterning non-magnetic crystals in a desired pattern, magnetize the patterned crystals. Accordingly, the patterned crystals may become a magnetic substance 1110 that forms a magnetic field in a certain direction. Accordingly, it is possible to dispose the magnetic substance 1110 in an area not overlapping with the touch electrodes X-TE and Y-TE and touch electrode connection lines X-CL and Y-CL by disposing crystals of several tens of nanometers (nm) in a desired pattern and magnetizing them.

Referring to FIG. 11, the magnetic substance 1110 may be disposed on the X-touch electrode X-TE, which is the driving touch electrode, around the X-touch electrode X-TE. The magnetic substance 1110 may be disposed to surround the X-touch electrode X-TE. The magnetic substance 1110 may be disposed to correspond to the edge of the X-touch electrode X-TE. The magnetic substance 1110 may be disposed around the X-touch electrode X-TE along the edge of the X-touch electrode X-TE.

The magnetic substance 1110 may be disposed as a magnetic substance pair 1110*a* and 1110*b*.

A magnetic field is formed around the X-touch electrode X-TE by the magnetic substance pair 1110*a* and 1110*b*. The direction of the magnetic field may be the same as or different from the direction of the magnetic field formed by the electric field in the direction from the X-touch electrode X-TE through the upper surface of the X-touch electrode X-TE.

For example, the magnetic substance pair 1110*a* and 1110*b* may be disposed with the N pole and the S pole adjacent to each other.

The reason why the electric field directed in the upper direction of the X-touch electrode X-TE is strengthened by the magnetic substance 1110 is as follows.

A magnetic field may be formed by the magnetic substance pair 1110*a* and 1110*b*, and an electric field in the direction perpendicular to the X-touch electrode X-TE is formed in the area surrounded by the magnetic substance pair 1110*a* and 1110*b*.

A pulse-type touch driving signal may be input to the X-touch electrode X-TE, and the direction of the electric field is thereby changed, and so is the density of the electric field over time.

First, during the period when the strength of the electric field outgoing from the X-touch electrode X-TE in the upper direction becomes strong (that is, while the capacitor having the X-touch electrode X-TE and the Y-touch electrode Y-TE as two opposite ends is charged), the density of the electric field increases in the area surrounded by the magnetic substance pair 1110*a* and 1110*b*.

According to the electromagnetic induction phenomenon, a magnetic field is formed, around the magnetic substance 1110, in a direction in which the density of the electric field decreases. Around the magnetic substance 1110, an electric field is formed in a direction in which the density of the electric field decreases.

Accordingly, the electric field directed in the upper direction from the X-touch electrode X-TE is directed in the upper direction in a central area of the X-touch electrode X-TE relatively far away from the magnetic substance 1110.

Accordingly, the density of the electric field directed in the upper direction of the X-touch electrode X-TE increases in the central area of the X-touch electrode X-TE, so that a stronger electric field is formed in the upper direction in the central area of the X-touch electrode X-TE.

Accordingly, an electric field may be formed to an area far away from the X-touch electrode X-TE in the upper direction, so that the function of the hover touch may be implemented.

Second, during the period when the strength of the electric field outgoing from the X-touch electrode X-TE in the upper direction becomes weak (that is, while the capacitor having the X-touch electrode X-TE and the Y-touch electrode Y-TE as two opposite ends is discharged), the density of the electric field decreases in the area surrounded by the magnetic substance pair 1110*a* and 1110*b*.

According to the electromagnetic induction phenomenon, a magnetic field is formed, around the magnetic substance 1110, in a direction in which the density of the electric field increases. Around the magnetic substance 1110, an electric field is formed in a direction in which the density of the electric field increases.

Accordingly, the density of the electric field directed from the X-touch electrode X-TE in the upper direction is decreased in a relatively small extent even during the period when the capacitor is discharged.

Accordingly, the degree to which the density of the electric field directed in the upper direction of the X-touch electrode X-TE is reduced is relatively small compared to the case where the magnetic substance 1110 is not disposed on the X-touch electrode X-TE. Accordingly, the capacitance between the X-touch electrode X-TE and the Y-touch electrode Y-TE becomes relatively large, and the accuracy of touch sensing by the touch object 1020 (refer to the above-described FIG. 10) may increase.

Referring to FIG. 11, the magnetic substance 1110 may be disposed not to overlap with the touch electrodes X-TE and Y-TE and the touch electrode connection lines (e.g., X-CL and Y-CL). This may be to increase the capacitance between the X-touch electrode X-TE and the Y-touch electrode Y-TE.

For the foregoing reasons, an electric field may be formed to an area far away from the X-touch electrode X-TE in the upper direction, so that the function of the hover touch may be implemented.

Figure 12A:
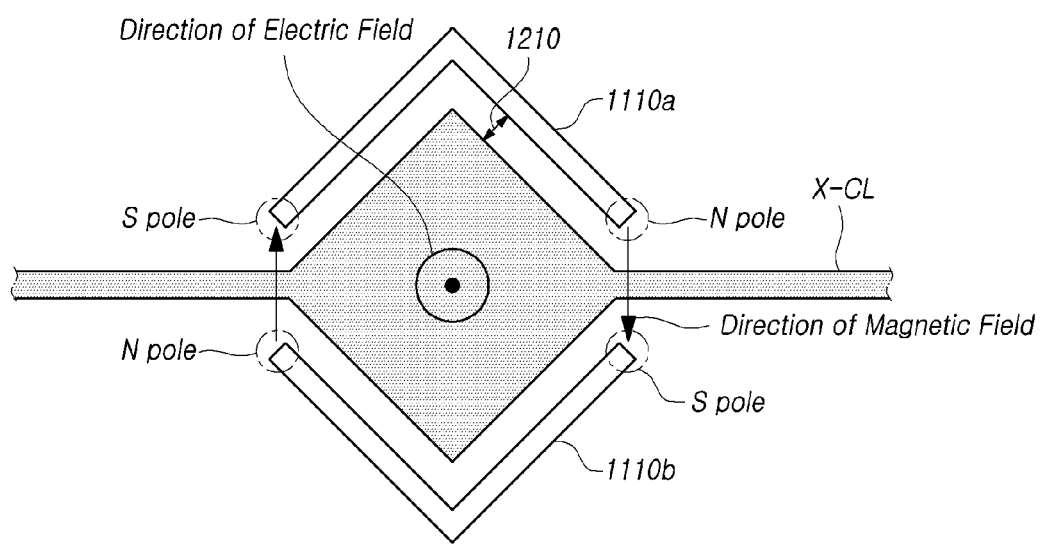
FIG. 12A is a view illustrating a reason why a high electric field of a touch electrode is formed in a vertical direction by a magnetic substance according to aspects of the disclosure.

FIG. 12A is a view illustrating a reason why a high electric field of a touch electrode is formed in a vertical direction by a magnetic substance according to aspects of the disclosure.

FIG. 12A is a view illustrating the touch display device when the front surface (the surface displaying the screen) is viewed.

FIG. 12A illustrates an example in which an electric field comes from the X-touch electrode X-TE in a vertical direction. Accordingly, in the area surrounded by the magnetic substance 1110, the electric flux density increases.

As a result of the increase in the electric flux density in the area surrounded by the magnetic substance 1110, the strength of the magnetic field increases in the direction for lowering the electric flux density.

Referring to FIG. 12A, the strength of the magnetic field increases in a clockwise direction. Accordingly, the electric flux density is reduced around the magnetic substance 1110.

Accordingly, the electric field lines from the X-touch electrode X-TE in the direction perpendicular to the ground may gather to the center of the X-touch electrode X-TE around the magnetic substance 1110.

Accordingly, the electric flux density in the central area of the X-touch electrode X-TE may increase, presenting such an effect as if a stronger voltage is applied to the X-touch electrode X-TE.

Accordingly, even when a pulse of a higher voltage is not substantially applied to the X-touch electrode X-TE, the X-touch electrode X-TE may form a stronger electric field in the upper direction of the X-touch electrode X-TE.

Accordingly, a hover touch is possible.

The magnetic substance 1110 may be disposed as a magnetic substance pair 1110*a* and 1110*b* to form a clockwise or counterclockwise magnetic field.

Although an example has been described in connection with FIG. 12A in which the magnetic substance pair 1110*a* and 1110*b* is disposed to form a magnetic field clockwise, aspects of the disclosure are not limited thereto.

The magnetic substance 1110 may be disposed around the X-touch electrode X-TE along the edge of the X-touch electrode X-TE.

Referring to FIG. 12A, when the X-touch electrode X-TE has a diamond shape, the magnetic substance pair 1110*a* and 1110*b* surround their respective corresponding edges around the X-touch electrode X-TE. The magnetic substance 1110 may be disconnected on the X-touch electrode connection line X-CL to be disposed as the magnetic substance pair 1110*a* and 1110*b*.

When the X-touch electrode X-TE is disposed on the touch display device in a shape different from the diamond shape, the shape in which the X-touch electrode X-TE surrounds may also be different from that shown in FIG. 12.

Figure 12B:
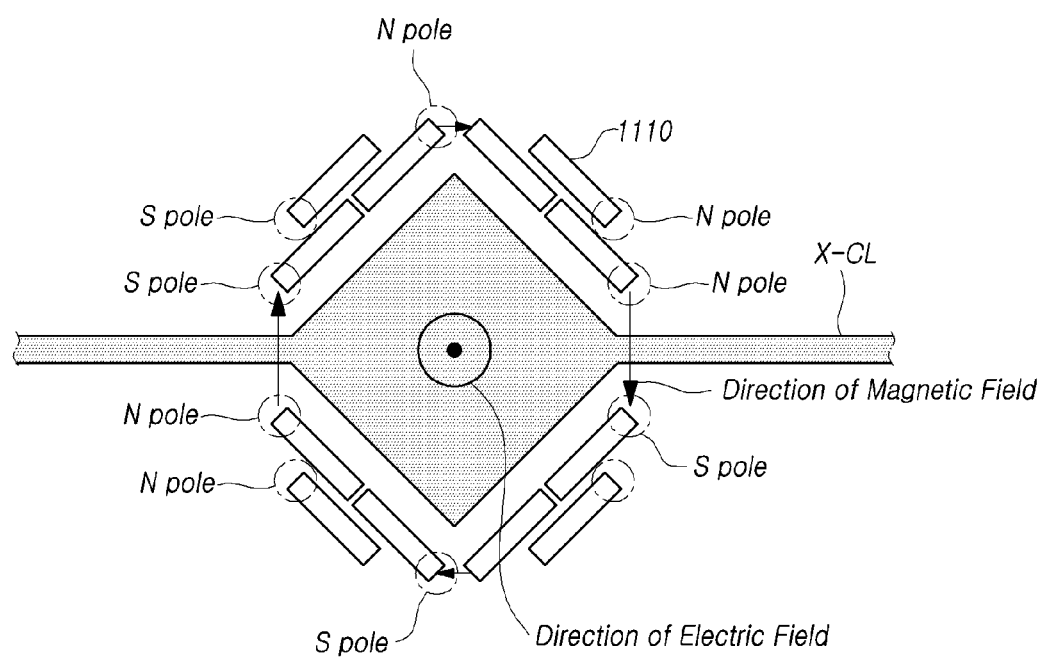
FIGS. 12B, 12C, and 12D are exemplarily illustrating an aspect in which various changes are made to the shape of the touch electrode or placement of the magnetic substance of FIG. 12A.
Figure 12C:
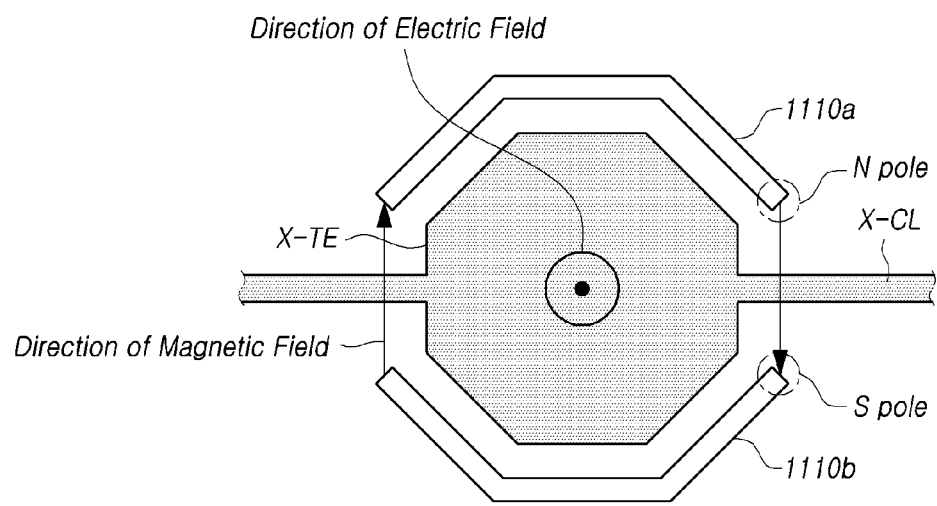
Figure 12D:
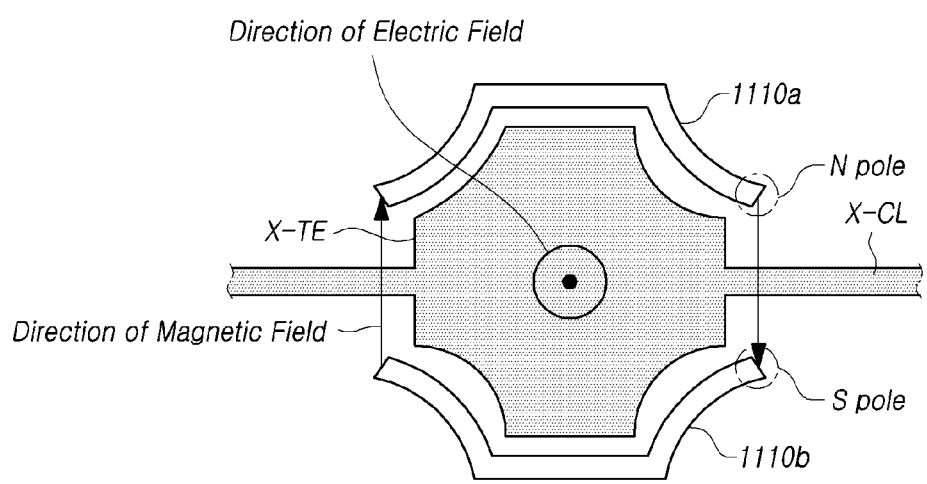

FIGS. 12B, 12C, and 12D are exemplarily illustrating an aspect in which various changes are made to the shape of the touch electrode or placement of the magnetic substance 1110 of FIG. 12A.

Referring to FIG. 12B, in the touch display device according to aspects of the disclosure, the magnetic substance 1110 having different thicknesses is disposed around the X-touch electrode.

Accordingly, it is possible to partially increase the strength of the magnetic field around the X-touch electrode X-TE. Accordingly, the strength of the electric field directed in the upper direction of the X-touch electrode X-TE may be further increased. Accordingly, the hover touch may be more easily implemented.

Referring to FIG. 12C, an aspect in which the X-touch electrode X-TE is disposed in an octagonal shape is illustrated.

The magnetic substance 1110 may be disposed along the edge of the octagonal X-touch electrode X-TE. In other words, depending on the shape of the X-touch electrode X-TE, the magnetic substance 1110 may be disposed in various shapes.

Referring to FIG. 12, a magnetic substance 1110 may be disposed along the edges of the X-touch electrode X-TE, except for the edges of the X-touch electrode X-TE overlapping with the X-touch electrode connection line X-CL.

FIG. 12D illustrates an aspect in which the X-touch electrode X-TE is disposed to have curved edges.

Referring to FIG. 12D, the magnetic substance 1110 may be disposed around the X-touch electrode X-TE along the curved edges and the straight edges of the X-touch electrode X-TE.

As described above, in the process of forming the magnetic substance 1110, the material of the magnetic substance 1110 may be patterned, in crystal units, around the X-touch electrode X-TE and be magnetized to form the magnetic substance 1110. Accordingly, even when the X-touch electrode X-TE has a shape with curved edges, it may be easy to dispose the magnetic substance 1110 to surround the X-touch electrode X-TE.

The magnetic substance 1110 may be spaced apart from the X-touch electrode X-TE by a distance 1210 in an area over the X-touch electrode X-TE without overlapping with the X-touch electrode X-TE.

The distance between the magnetic substance 1110 and the X-touch electrode X-TE may be designed to differ depending on the magnitude of the electric field formed from the X-touch electrode and the magnitude of the magnetic field formed by the magnetic substance pair 1110a and 1110b.

In a range where the magnetic substance 1110 and the X-touch electrode X-TE do not overlap with, as the distance between the magnetic substance 1110 and the X-touch electrode X-TE decreases, the electric flux density may increase, so that the distance at which hover touch may be implemented (a distance at which the touch display device may recognize a touch even when the touch object is away from the touch display device) may increase.

Figure 13:
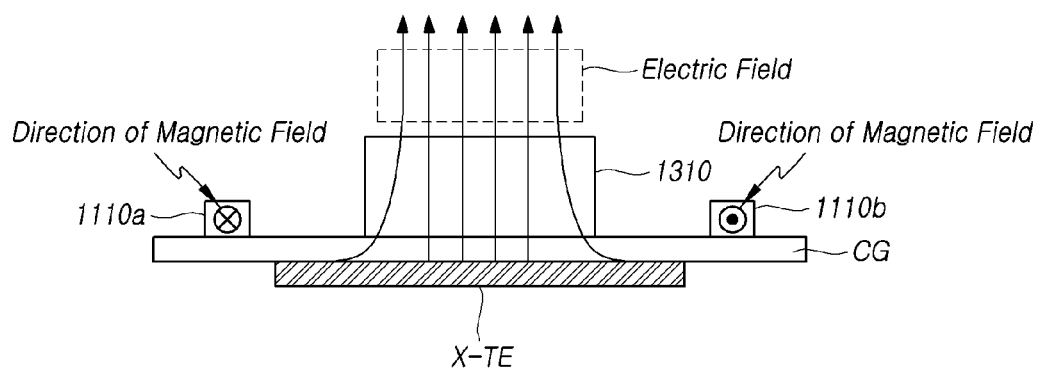
FIG. 13 is a concept view illustrating a touch display device further including an electric field guide material according to aspects of the disclosure.

FIG. 13 is a concept view illustrating a touch display device further including an electric field guide material 1310 according to aspects of the disclosure.

Referring to FIG. 13, an electric field guide material 1310 is disposed to overlap with the X-touch electrode X-TE.

The electric field guide material 1310 is configured to guide the direction of the electric field so that the electric field formed in the X-touch electrode X-TE may have a strong intensity in a desired direction.

Accordingly, the electric field guide material 1310 may be formed in the direction perpendicular to the X-touch electrode X-TE as shown in FIG. 13 or may be formed at an angle inclined from the direction perpendicular to the X-touch electrode X-TE.

The electric field guide material 1310 may be, e.g., a single element material. The electric field guide material 1310 may be implemented as, e.g., carbon nanotubes formed of carbon.

The electric field guide material 1310 may be disposed to extend in a direction for guiding the electric field using a graphene film formed of one layer of carbon atoms, as a wall.

The carbon forming the carbon nanotube is sp2 bonded to the surrounding carbon.

For example, to make it easier to recognize a touch object approaching from the upper right end of the touch display device, the electric field guide material 1310 may be disposed to be inclined from the direction perpendicular to the X-touch electrode X-TE. Accordingly, the touch display device may more easily recognize the object approaching from the right direction of the touch display device.

The electric field guide material 1310 may be disposed in the direction perpendicular to the X-touch electrode X-TE or to be inclined at a predetermined angle from the perpendicular direction, or to be bent. Accordingly, the strength of the electric field in a previously desired direction may be rendered stronger.

One or more electric field guide materials 1310 may be disposed on the X-touch electrode X-TE.

Referring to FIG. 13, the electric field guide material 1310 may be directly disposed on the cover glass CG or may be formed on a separate substrate which is then formed on the cover glass CG. In some cases, the electric field guide material 1310 may be formed on a separate substrate and disposed on the X-touch electrode X-TE, and a cover glass CG may be disposed on the substrate on which the electric field guide material 1310 is disposed.

The electric field guide material 1310 may be fixed by an organic insulation layer (not shown, refer to the component 1720 of FIG. 17) including an organic insulating material. The organic insulation layer may cover the electric field guide material 1310.

A length of the electric field guide material 1310 (a length in a vertical direction from the X-touch electrode X-TE) may be larger than a height of the magnetic substance pair 1110a and 1110b.

Figure 14:
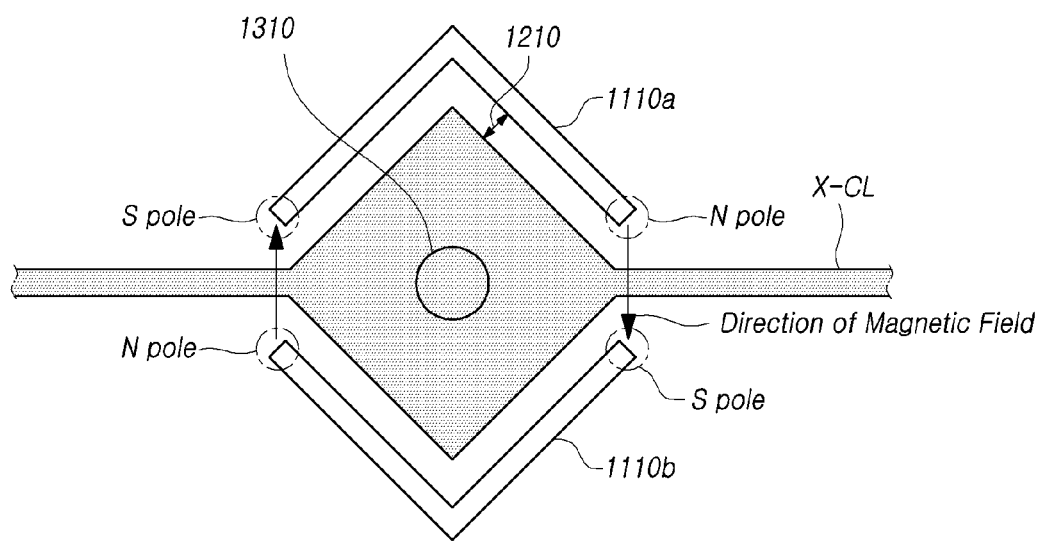
FIG. 14 is a view exemplarily illustrating an electric field guide material positioned to overlap with a touch electrode, based on the shape of the touch electrode and the placement of the magnetic substance described in connection with FIG. 12A, according to aspects of the disclosure.

FIG. 14 is a view exemplarily illustrating an electric field guide material 1310 positioned to overlap with a touch electrode, based on the shape of the touch electrode and the placement of the magnetic substance described in connection with FIG. 12A, according to aspects of the disclosure.

Referring to FIG. 14, an electric field guide material 1310 is disposed on the X-touch electrode X-TE to overlap with the X-touch electrode X-TE.

The electric field guide material 1310 may be disposed in the area surrounded by the magnetic substance pair 1110a and 1110b.

The electric field guide material 1310 may be disposed on the X-touch electrode X-TE in the area surrounded by the magnetic substance pair 1110a and 1110b, so that the direction of the electric field focused to the central area of the X-touch electrode X-TE may be easily guided in any one direction.

Accordingly, a very strong electric field may be formed in the direction guided by the electric field guide material 1310.

Accordingly, it is possible to implement a hover touch by a touch object approaching not only from the vertical direction of the touch display device but also from an oblique direction. It is also possible to significantly increase the sensing accuracy of the hover touch by the touch object approaching from an oblique direction.

In FIG. 14, the placement of the electric field guide material 1310 has been described based on the shape of the X-touch electrode X-TE and the placement of the magnetic substance pair 1110*a* and 1110*b* as shown in FIG. 12A, but may also be applicable to the shape of the X-touch electrode X-TE and the placement of the magnetic substance 1110 described above in connection with FIGS. 12B to 12D. However, this is merely an example, and the disclosure is not limited thereto.

Figure 15:
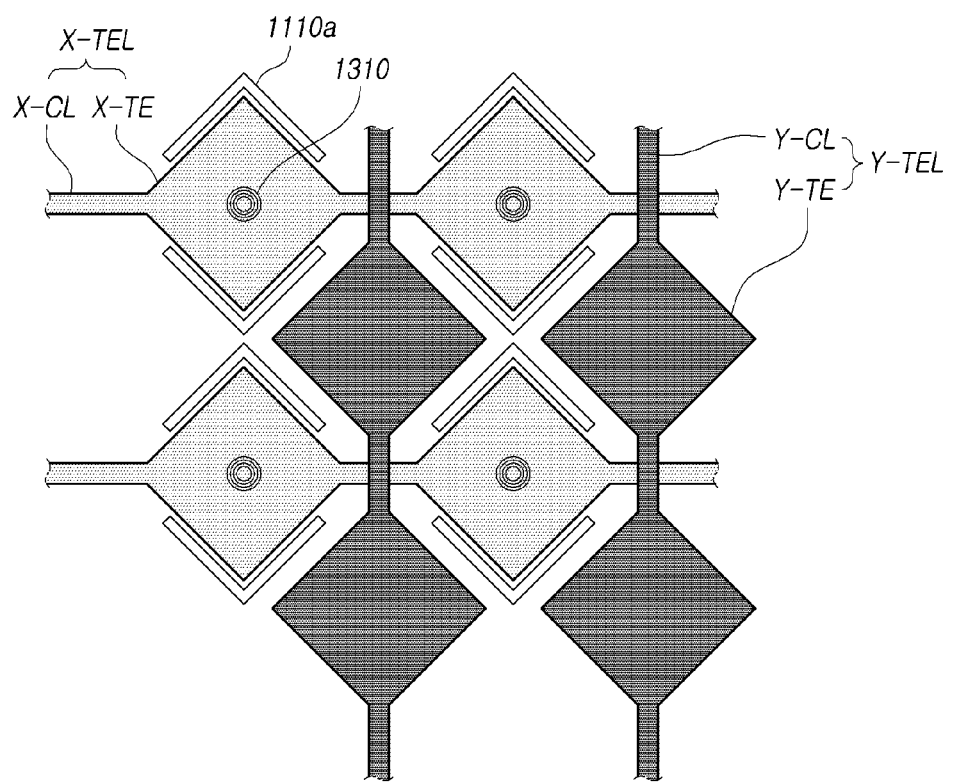
FIG. 15 is a view illustrating an example in which an electric field guide material is disposed on a plurality of touch electrodes.

FIG. 15 is a view illustrating an example in which an electric field guide 1310 material is disposed on a plurality of touch electrodes.

Referring to FIG. 15, the electric field guide materials 1310 may be positioned on the X-touch electrodes X-TE, which are touch electrodes to which pulse-type touch driving signals are input.

The electric field guide materials 1310 may be disposed in the same direction on the X-touch electrodes X-TE or may be disposed in different directions on at least one X-touch electrode X-TE.

For example, the electromagnetic field guide material 1310 on the upper left X-touch electrode X-TE among the X-touch electrodes X-TE shown in FIG. 15 may be disposed to be bent in the upper left direction to easily sense a touch object approaching from the upper left end.

The electromagnetic field guide material 1310 on the upper right X-touch electrode X-TE among the X-touch electrodes X-TE shown in FIG. 15 may be disposed to be bent in the upper right direction to easily sense a touch object approaching from the upper right end.

The electromagnetic field guide material 1310 on the lower left X-touch electrode X-TE among the X-touch electrodes X-TE shown in FIG. 15 may be disposed to be bent in the lower left direction to easily sense a touch object approaching from the lower left end.

The electromagnetic field guide material 1310 on the lower right X-touch electrode X-TE among the X-touch electrodes X-TE shown in FIG. 15 may be disposed to be bent in the lower right direction to easily sense a touch object approaching from the lower right end.

Accordingly, each of the X-touch electrodes X-TE may easily sense a touch object approaching from two or more directions.

Figure 16:
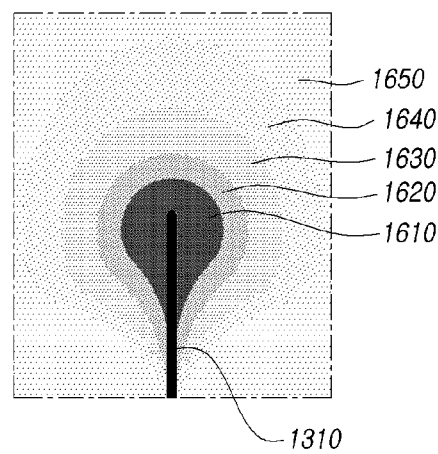
FIG. 16 is a view illustrating an example in which an electric field is guided by an electric field guide material.

FIG. 16 is a view illustrating an example in which an electric field is guided by an electric field guide material 1310.

Referring to FIG. 16, the electric field input from one end of the electric field guide material 1310 exits to the other end of the electric field guide material 1310 to form an electric field at the other end of the electric field guide material 1310.

Accordingly, the strength of the electric field is strongest in the area 1610 close to the other end of the electric field guide material 1310 and, away from the other end, the strength of the electric field gradually weakens.

Referring to FIG. 16, the strength of the electric field is somewhat weak in an area 1620 further away from the area 1610 closest to the other end, weaker in an area 1630 further away therefrom, and much weaker in an area 1640 further away therefrom. In the furthest area 1650, the effect by the electric field is very small.

Accordingly, it is possible to very effectively transfer the electric field input to one end of the electric field guide material 1310 to the other end by the electric field guide material 1310.

The electric field guide material 1310 may be implemented of carbon nanotubes.

Figure 17:
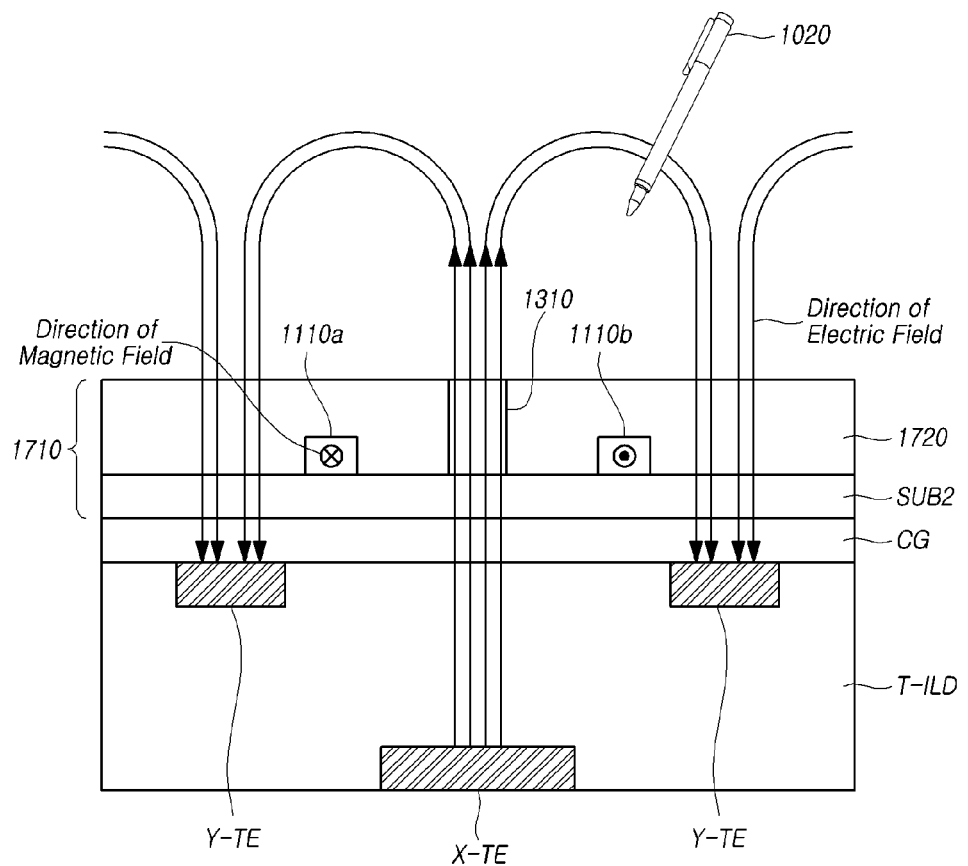
FIG. 17 is a view illustrating an example in which a hover touch is implemented in a touch display device according to aspects of the disclosure.

FIG. 17 is a view illustrating an example in which a hover touch is implemented in a touch display device according to aspects of the disclosure.

Referring to FIG. 17, in the touch display device according to aspects of the disclosure, an electric field from the X-touch electrode X-TE to the Y-touch electrode Y-TE is formed to a distance far away from the X-touch electrode X-TE by the magnetic substance pair 1110*a* and 1110*b*.

In the touch display device according to aspects of the disclosure, the direction in which an electric field is formed may be guided by the electric field guide material 1310. Accordingly, it is possible to reinforce the performance of touch sensing by a touch object approaching not only from the front surface of the touch display device but also from an oblique direction.

Referring to FIG. 17, the X-touch electrode X-TE and the Y-touch electrode Y-TE may be positioned to be insulated from each other, with the touch insulation film T-ILD disposed therebetween. The X-touch electrode X-TE and the Y-touch electrode Y-TE may be positioned on one layer or on different layers.

When the X-touch electrode X-TE and the Y-touch electrode Y-TE are positioned on different layers, no contact hole for connecting the X-touch electrodes X-TE to each other may be provided, and no contact hole for connecting the Y-touch electrodes Y-TE to each other may be provided. Accordingly, the X-touch electrode X-TE and the Y-touch electrode Y-TE may be formed to have similar resistances.

A protection layer (PAC, refer to FIG. 9) may be interposed between the X-touch electrode X-TE and the Y-touch electrode Y-TE and the cover glass CG. The touch display device according to aspects of the disclosure may further include at least one polarizing plate (not shown) configured to prevent light reflection of external light. The polarizing plate, e.g., may be positioned on the lower surface of the cover glass CG.

The above-described magnetic substance pair 1110*a* and 1110*b* and/or the electric field guide material 1310 may be disposed on the substrate SUB2. The substrate SUB2 may be a transparent plastic substrate or a film-type substrate.

The substrate SUB2 where the magnetic substance pair 1110*a* and 1110*b* and/or the electric field guide material 1310 is formed may be attached and coupled to the upper surface of the cover glass CG in an add-on type.

An organic insulation layer 1720 covering the magnetic substance pair 1110*a* and 1110*b* and the electric field guide material 1310 may be further positioned on the substrate SUB2. The position of the electric field guide material 1310 and/or the magnetic substance pair 1110*a* and 1110*b* may be fixed by the organic insulation layer 1720.

The organic insulation layer 1720 may be disposed to cover the magnetic substance pair 1110*a* and 1110*b* and/or the electric field guide material 1310.

Aspects of the disclosure may provide a film 1710 for a touch display device including a substrate SUB2 and a magnetic substance 1110 positioned on the substrate SUB2.

The film 1710 for a touch display device may further include an electric field guide material 1310.

The film 1710 for a touch display device may be disposed on the front surface of the touch electrodes X-TE and Y-TE.

The film 1710 for a touch display device may be an add-on type film that is attached and coupled to the front surface of the cover glass CG.

Figure 18:
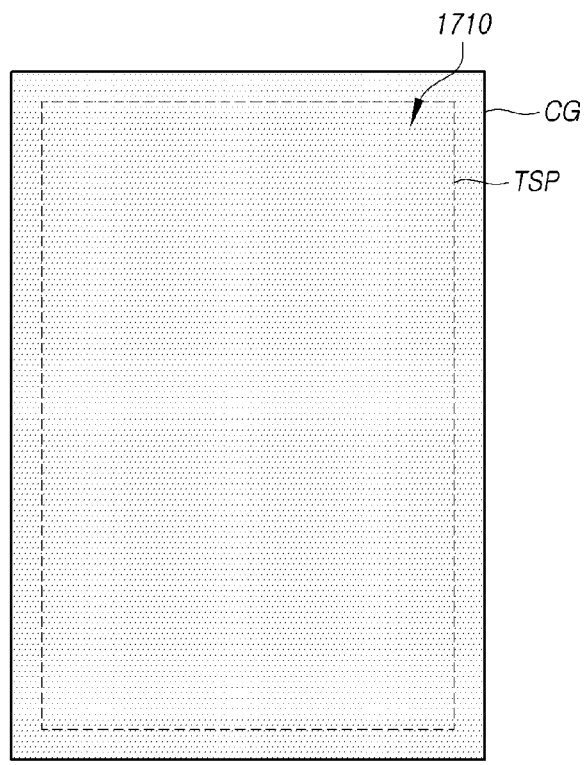
FIG. 18 is a view illustrating an example in which a film for a touch display device is disposed on a front surface of a cover glass according to aspects of the disclosure.

FIG. 18 is a view illustrating an example in which a film 1710 for a touch display device is disposed on a front surface of a cover glass CG according to aspects of the disclosure.

Referring to FIG. 18, the film 1710 for a touch display device according to aspects of the disclosure may be attached to the front surface of the cover glass CG positioned on the touch panel TSP.

Accordingly, the touch display device according to aspects of the disclosure may provide a hover touch function.

In some cases, the film 1710 for a touch display device may be implemented to be detachable. Accordingly, in a state in which the film 1710 for a touch display device is not attached, the touch display device may provide a proximity touch function. In a state in which the film 1710 for a touch display device is attached, the touch display device may further provide a hover touch function.

The foregoing aspects are briefly described below.

Aspects of the disclosure may provide a touch display device 100 comprising a display panel DISP having a plurality of subpixels SP and a plurality of data lines DL and a plurality of gate lines GL electrically connected with the plurality of subpixels SP, a touch panel TSP having a plurality of driving touch electrodes (e.g., X-touch electrodes X-TE) positioned to overlap with at least one subpixel among the plurality of subpixels SP, a touch driving signal for touch sensing applied to one or more driving touch electrodes (e.g., X-touch electrodes X-TE) among the plurality of driving touch electrodes (e.g., X-touch electrodes X-TE) and a magnetic substance 1110 disposed around each of the plurality of driving touch electrodes (e.g., X-touch electrodes X-TE), on the plurality of driving touch electrodes (e.g., X-touch electrodes X-TE).

Aspects of the disclosure may provide the touch display device 100, wherein the plurality of driving touch electrodes (e.g., X-touch electrodes X-TE) are electrically connected with each other through a touch electrode connection line (e.g., X-touch electrode connection line X-TEL), and wherein the magnetic substance 1110 is disposed to be spaced apart from the touch electrode connection line (e.g., X-touch electrode connection line X-TEL).

Aspects of the disclosure may provide the touch display device 100, wherein the magnetic substance 1110 is patterned along an edge of the driving touch electrodes (e.g., X-touch electrodes X-TE), in an area on the plurality of driving touch electrodes (e.g., X-touch electrodes X-TE).

Aspects of the disclosure may provide the touch display device 100, wherein the touch panel TSP further includes a plurality of sensing touch electrodes (e.g., Y-touch electrodes Y-TE) forming a capacitance with the plurality of driving touch electrodes (e.g., X-touch electrodes X-TE).

Aspects of the disclosure may provide the touch display device 100, wherein the plurality of driving touch electrodes (e.g., X-touch electrodes X-TE) and the plurality of sensing touch electrodes (e.g., Y-touch electrodes Y-TE) are positioned on different layers, with a touch insulation film T-ILD interposed therebetween.

Aspects of the disclosure may provide the touch display device 100, wherein the magnetic substance 1110 is formed of a magnetic substance pair 1110*a* and 1110*b*, and wherein a direction formed by the magnetic substance pair 1110*a* and 1110*b* is opposite to a direction of a magnetic field formed by an electric field directed to an upper surface of the plurality of driving touch electrodes (e.g., X-touch electrodes X-TE).

Aspects of the disclosure may provide the touch display device 100, further comprising an electric field guide material 1310 positioned to overlap with each of the plurality of driving touch electrodes (e.g., X-touch electrodes X-TE).

Aspects of the disclosure may provide the touch display device 100, wherein the electric field guide material 1310 is formed of a single element.

Aspects of the disclosure may provide the touch display device 100, wherein the single element is carbon.

Aspects of the disclosure may provide the touch display device 100, wherein the electric field guide material 1310 is a carbon nanotube.

Aspects of the disclosure may provide the touch display device 100, wherein the electric field guide material 1310 is positioned in a direction inclined from a direction perpendicular to the plurality of driving touch electrodes (e.g., X-touch electrodes X-TE).

Aspects of the disclosure may provide the touch display device 100, wherein the electric field guide material 1310 is disposed to be inclined in two or more different directions depending on positions on the touch panel TSP.

Aspects of the disclosure may provide the touch display device 100, further comprising a cover glass CG disposed on the display panel DISP and a substrate SUB2 positioned on the cover glass CG and having the magnetic substance 1110 disposed thereon.

Aspects of the disclosure may provide the touch display device 100, wherein the magnetic substance 1110 is covered by an organic insulation layer including an organic material.

Aspects of the disclosure may provide the touch display device 100, wherein a pair of magnetic substances 1110 are formed for each of the plurality of driving touch electrodes (e.g., X-touch electrodes X-TE).

Aspects of the disclosure may provide a film 1710 for a touch display device 100, the touch display device 100 comprising a display panel DISP having a plurality of subpixels SP and a plurality of data lines DL and a plurality of gate lines GL electrically connected with the plurality of subpixels SP and a touch panel TSP having a plurality of driving touch electrodes (e.g., X-touch electrodes X-TE) positioned to overlap with at least one subpixel among the plurality of subpixels SP, a touch driving signal for touch sensing applied to one or more driving touch electrodes (e.g., X-touch electrodes X-TE) among the plurality of driving touch electrodes (e.g., X-touch electrodes X-TE), wherein the film 1710 for the touch display device 100 comprises a substrate SUB2 and a magnetic substance 1110 positioned on the substrate SUB2 and disposed around each of the plurality of driving touch electrodes (e.g., X-touch electrodes X-TE), on the plurality of driving touch electrodes (e.g., X-touch electrodes X-TE).

Aspects of the disclosure may provide the film 1710 for the touch display device 100, wherein a direction of a magnetic field generated by the magnetic substance 1110 corresponds to a direction of a magnetic field formed by an electric field having a direction perpendicular to the substrate SUB2.

Aspects of the disclosure may provide the film 1710 for the touch display device 100, further comprising an electric field guide material 1310 positioned on the substrate SUB2.

Aspects of the disclosure may provide the film 1710 for the touch display device 100, wherein the electric field guide material 1310 is a carbon nanotube.

Aspects of the disclosure may provide the film 1710 for the touch display device 100, wherein the electric field guide material 1310 is disposed to extend in an inclined direction from a direction perpendicular to the substrate SUB2.

The above description has been presented to enable any person skilled in the art to make and use the technical idea of the disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the disclosure. The above description and the accompanying drawings provide an example of the technical idea of the disclosure for illustrative purposes only. That is, the disclosed aspects are intended to illustrate the scope of the technical idea of the disclosure. Thus, the scope of the disclosure is not limited to the aspects shown, but is to be accorded the widest scope consistent with the claims. The scope of protection of the disclosure should be construed based on the following claims, and all technical ideas within the scope of equivalents thereof should be construed as being included within the scope of the disclosure.

What is claimed is:

1. A touch display device, comprising:
a display panel having a plurality of subpixels and having a plurality of data lines and a plurality of gate lines electrically connected with the plurality of subpixels;
a touch panel having a plurality of driving touch electrodes positioned to overlap with at least one subpixel among the plurality of subpixels, a touch driving signal for touch sensing applied to one or more driving touch electrodes among the plurality of driving touch electrodes; and a magnetic substance disposed along the edge of the one or more driving touch electrodes which the touch driving signal for touch sensing is applied to, and positioned on a different layer from the plurality of driving touch electrodes.

2. The touch display device of claim 1, wherein the plurality of driving touch electrodes are electrically connected with each other through a touch electrode connection line, and
wherein the magnetic substance is spaced apart from the touch electrode connection line.

3. The touch display device of claim 1, wherein the magnetic substance is patterned along an edge of the driving touch electrodes, in an area on the plurality of driving touch electrodes.

4. The touch display device of claim 1, wherein the touch panel further includes a plurality of sensing touch electrodes forming a capacitance with the plurality of driving touch electrodes.

5. The touch display device of claim 4, wherein the plurality of driving touch electrodes and the plurality of sensing touch electrodes are positioned on different layers, with a touch insulation film interposed therebetween.

6. The touch display device of claim 1, wherein the magnetic substance is formed of a magnetic substance pair, and
wherein a direction formed by the magnetic substance pair is opposite to a direction of a magnetic field formed by an electric field directed to an upper surface of the plurality of driving touch electrodes.

7. The touch display device of claim 1, further comprising an electric field guide material positioned to overlap with each of the plurality of driving touch electrodes.

8. The touch display device of claim 7, wherein the electric field guide material is formed of a single element.

9. The touch display device of claim 8, wherein the single element is carbon.

10. The touch display device of claim 7, wherein the electric field guide material is a carbon nanotube.

11. The touch display device of claim 7, wherein the electric field guide material is positioned in a direction inclined from a direction perpendicular to the plurality of driving touch electrodes.

12. The touch display device of claim 7, wherein the electric field guide material is disposed to be inclined in two or more different directions depending on positions on the touch panel.

13. The touch display device of claim 1, further comprising:
a cover glass disposed on the display panel; and
a substrate positioned on the cover glass and having the magnetic substance disposed thereon.

14. The touch display device of claim 13, wherein the magnetic substance is covered by an organic insulation layer including an organic material.

15. The touch display device of claim 1, wherein a pair of magnetic substances are formed for each of the plurality of driving touch electrodes.

16. The touch display device of claim 15, further comprising an electric field guide material disposed on the driving touch electrode of the plurality of driving touch electrodes corresponding to the pair of magnetic substances in the area surrounded by the pair of magnetic substances.

17. A film for a touch display device, the touch display device comprising:
a display panel having a plurality of subpixels, and having a plurality of data lines and a plurality of gate lines electrically connected with the plurality of subpixels; and a touch panel having a plurality of driving touch electrodes positioned to overlap with at least one subpixel among the plurality of subpixels, a touch driving signal for touch sensing applied to one or more driving touch electrodes among the plurality of driving touch electrodes, wherein the film for the touch display device comprises:
a substrate; and
a magnetic substance positioned on the substrate and disposed along the edge of the one or more driving touch electrodes which the touch driving signal for touch sensing is applied to, and positioned on a different layer from the plurality of driving touch electrodes.

18. The film for the touch display device of claim 17, wherein a direction of a magnetic field generated by the magnetic substance corresponds to a direction of a magnetic field formed by an electric field having a direction perpendicular to the substrate.

19. The film for the touch display device of claim 17, further comprising an electric field guide material positioned on the substrate.

20. The film for the touch display device of claim 19, wherein the electric field guide material is a carbon nanotube.

21. The film for the touch display device of claim 19, wherein the electric field guide material is disposed to extend in an inclined direction from a direction perpendicular to the substrate.

* * * * *